United States Patent
Tsang et al.

(10) Patent No.: US 9,812,193 B2
(45) Date of Patent: Nov. 7, 2017

(54) THRESHOLD ESTIMATION USING BIT FLIP COUNTS AND MINIMUMS

(71) Applicant: SK Hynix Inc., Gyeonggi-do (KR)

(72) Inventors: Christopher S. Tsang, Santa Clara, CA (US); Frederick K. H. Lee, Mountain View, CA (US); Xiangyu Tang, San Jose, CA (US); Zheng Wu, San Jose, CA (US); Jason Bellorado, San Jose, CA (US)

(73) Assignee: SK Hynix Inc., Gyeonggi-do (KR)

( * ) Notice: Subject to any disclaimer, the term of this patent is extended or adjusted under 35 U.S.C. 154(b) by 383 days.

(21) Appl. No.: 14/480,988

(22) Filed: Sep. 9, 2014

(65) Prior Publication Data

US 2015/0131376 A1   May 14, 2015

Related U.S. Application Data

(60) Provisional application No. 61/901,960, filed on Nov. 8, 2013.

(51) Int. Cl.
| | |
|---|---|
| *G11C 11/56* | (2006.01) |
| *G11C 16/26* | (2006.01) |
| *G11C 16/34* | (2006.01) |

(52) U.S. Cl.
CPC .......... *G11C 11/5642* (2013.01); *G11C 16/26* (2013.01); *G11C 16/3404* (2013.01)

(58) Field of Classification Search
CPC ............ G11C 11/5628; G11C 11/5642; G11C 16/3404
See application file for complete search history.

(56) References Cited

U.S. PATENT DOCUMENTS

| | | | |
|---|---|---|---|
| 7,447,970 B2 | 11/2008 | Wu et al. | |
| 7,975,192 B2 | 7/2011 | Sommer et al. | |
| 8,243,514 B2 | 8/2012 | Kang et al. | |
| 8,482,978 B1 | 7/2013 | Perlmutter et al. | |
| 9,007,854 B1* | 4/2015 | Nemati Anaraki | ..... G06F 11/10 365/189.09 |
| 2009/0310404 A1* | 12/2009 | Cho | ......... G11C 7/06 365/185.2 |
| 2011/0182119 A1 | 7/2011 | Strasser et al. | |
| 2012/0182810 A1 | 7/2012 | Radke et al. | |

(Continued)

FOREIGN PATENT DOCUMENTS

CN   103295635   9/2013

OTHER PUBLICATIONS

U.S. Appl. No. 13/935,714, "Generating Read Thresholds Using Gradient Descent and Without Side Information", filed Jul. 5, 2013

(Continued)

*Primary Examiner* — Steve Nguyen

(74) *Attorney, Agent, or Firm* — IP & T Group LLP

(57) ABSTRACT

A bit flip count is determined for each bin in a plurality of bins, including by: (1) performing a first read on a group of solid state storage cells at a first threshold that corresponds to a lower bound for a given bin and (2) performing a second read on the group of solid state storage cells at a second threshold that corresponds to an upper bound for the given bin. A minimum is determined using the bit flip counts corresponding to the plurality of bins and the minimum is used to estimate an optimal threshold.

21 Claims, 21 Drawing Sheets

(56) References Cited

U.S. PATENT DOCUMENTS

| | | | |
|---|---|---|---|
| 2013/0033933 A1* | 2/2013 | Park | G11C 11/5642 |
| | | | 365/185.03 |
| 2013/0215682 A1 | 8/2013 | Yang | |
| 2013/0336072 A1* | 12/2013 | Wood | G11C 16/20 |
| | | | 365/185.24 |
| 2014/0126285 A1 | 5/2014 | Kang | |
| 2014/0355340 A1* | 12/2014 | Sharon | G11C 16/26 |
| | | | 365/185.03 |
| 2014/0359202 A1* | 12/2014 | Sun | G11C 16/34 |
| | | | 711/103 |
| 2014/0365172 A1* | 12/2014 | Liao | G11C 16/06 |
| | | | 702/179 |
| 2015/0085571 A1* | 3/2015 | Hu | G11C 16/26 |
| | | | 365/185.03 |

OTHER PUBLICATIONS

U.S. Appl. No. 13/935,714, Office Action, Mailed Aug. 11, 2014.
Office Action issued by the State Intellectual Property Office dated May 27, 2017.

\* cited by examiner

| Read Number | Read Description |
|---|---|
| 1 | 1st SLC Assist Read |
| 2 | LSB Read @ ($R_{1a}$, $R_{1c}$) |
| 3 | LSB Read @ ($R_{2a}$, $R_{2c}$) |
| 4 | LSB Read @ ($R_{3a}$, $R_{3c}$) |
| 5 | LSB Read @ ($R_{4a}$, $R_{4c}$) |
| 6 | LSB Read @ ($R_{5a}$, $R_{5c}$) |
| 7 | LSB Read @ ($R_{6a}$, $R_{6c}$) |
| 8 | 2nd SLC Assist Read |
| 9 | MSB Read @ ($R_{1a'}$, $R_{1c'}$) |
| 10 | MSB Read @ ($R_{2a'}$, $R_{2c'}$) |
| 11 | MSB Read @ ($R_{3a'}$, $R_{3c'}$) |
| 12 | MSB Read @ ($R_{4a'}$, $R_{4c'}$) |
| 13 | MSB Read @ ($R_{5a'}$, $R_{5c'}$) |
| 14 | MSB Read @ ($R_{6a'}$, $R_{6c'}$) |
| 15 | 3rd SLC Assist Read |
| 16 | 4th SLC Assist Read |
| 17 | CSB Read @ ($R_{1a''}$, $R_{1b''}$, $R_{1c''}$) |
| 18 | CSB Read @ ($R_{2a''}$, $R_{2b''}$, $R_{2c''}$) |
| 19 | CSB Read @ ($R_{3a''}$, $R_{3b''}$, $R_{3c''}$) |
| 20 | CSB Read @ ($R_{4a''}$, $R_{4b''}$, $R_{4c''}$) |
| 21 | CSB Read @ ($R_{5a''}$, $R_{5b''}$, $R_{5c''}$) |
| 22 | CSB Read @ ($R_{6a''}$, $R_{6b''}$, $R_{6c''}$) |

Rows 1–7: 1300
Rows 8–14: 1302
Rows 15–22: 1304

FIG. 13

FIG. 17
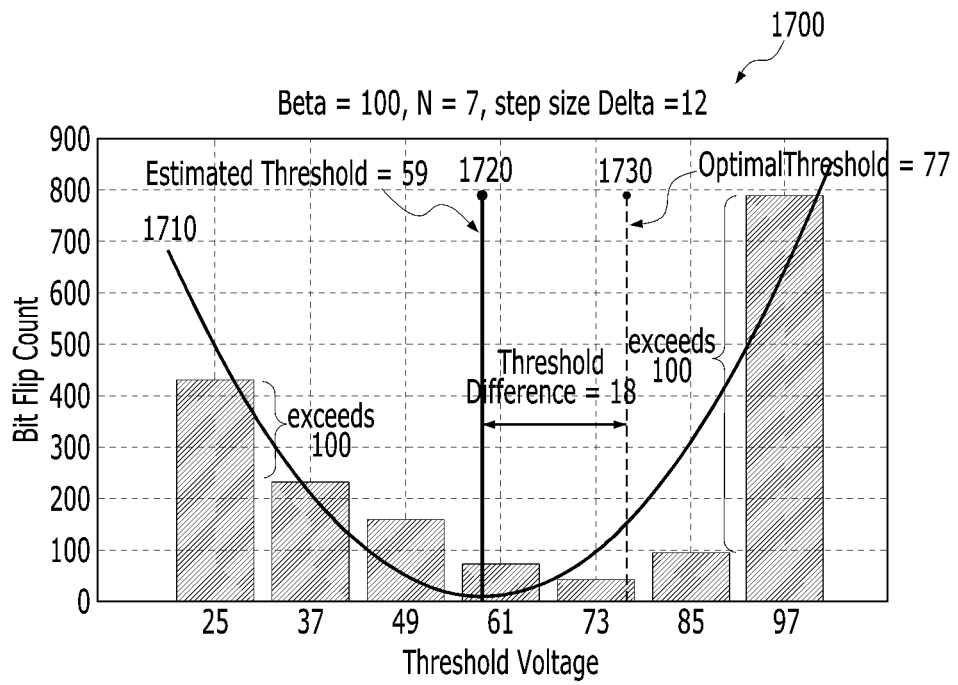
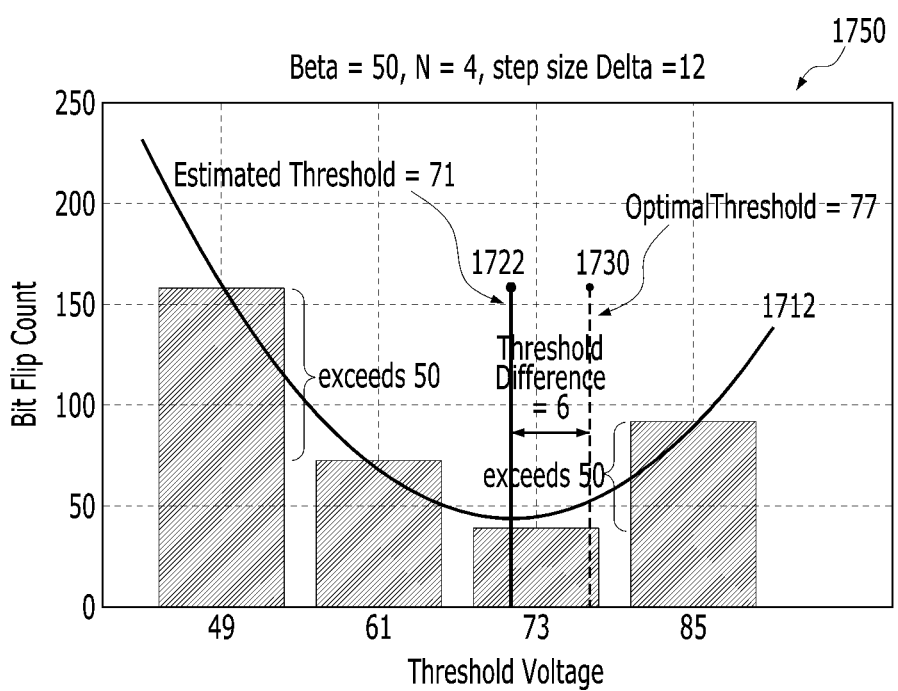

ML THRESHOLD ESTIMATION FOR NAND-BASED STORAGE DEVICES filed Nov. 8, 2013 which is incorporated herein by reference for all purposes.

THRESHOLD ESTIMATION USING BIT FLIP COUNTS AND MINIMUMS

CROSS REFERENCE TO OTHER APPLICATIONS

This application claims priority to U.S. Provisional Patent Application No. 61/901,960 entitled SIMPLIFIED OPTIMAL THRESHOLD ESTIMATION FOR NAND-BASED STORAGE DEVICES filed Nov. 8, 2013 which is incorporated herein by reference for all purposes.

BACKGROUND OF THE INVENTION

In solid state storage systems, one or more thresholds are used to read the solid state storage. The selection of these thresholds is important because it affects the number of bit errors contained in the read-back bit sequence. Naturally, it would be desirable to use the optimal threshold (i.e., the threshold which returns the fewest bit errors). Although techniques for estimating an optimal threshold already exist, under certain conditions these techniques may be unable to converge on the actual optimal threshold (e.g., the system gets "stuck" and/or converges on an estimate that is a poor estimate). New optimal threshold estimation techniques which avoid such problems would be desirable.

BRIEF DESCRIPTION OF THE DRAWINGS

Various embodiments of the invention are disclosed in the following detailed description and the accompanying drawings.

FIG. 13 is a diagram illustrating an embodiment of reads performed in order to estimate optimal thresholds for TLC storage.

FIG. 17 is a diagram illustrating an embodiment of curves which are fitted to filtered data points and unfiltered data points.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Figure 1:
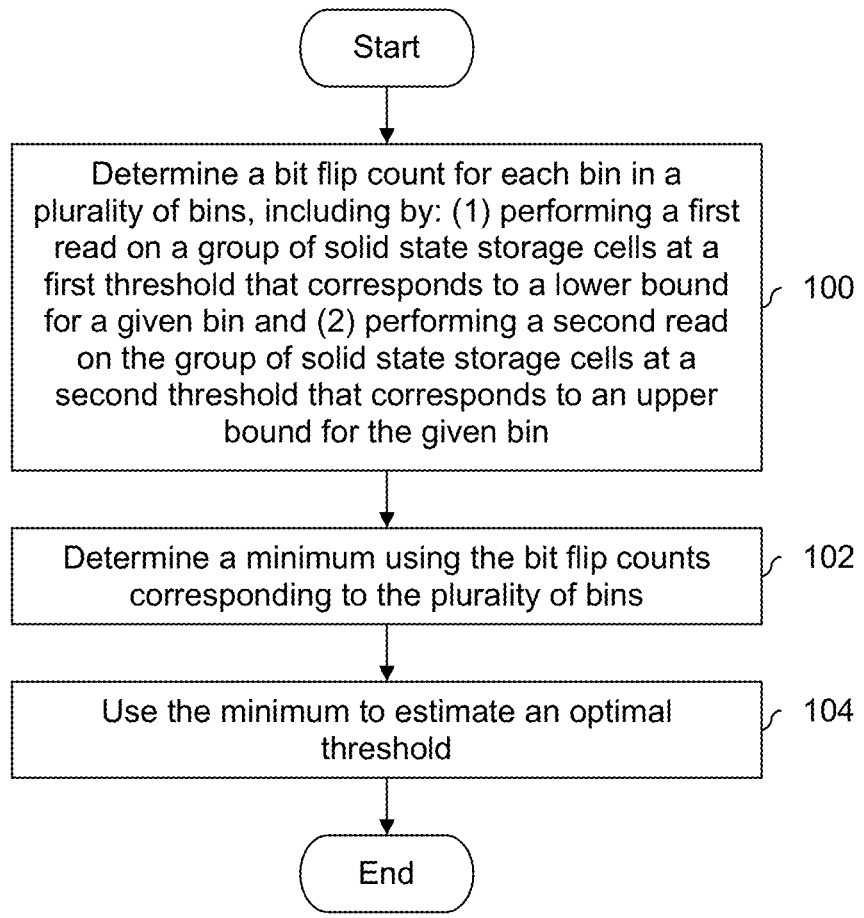
FIG. 1 is a flowchart illustrating an embodiment of a process for estimating an optimal threshold.

FIG. 1 is a flowchart illustrating an embodiment of a process for estimating an optimal threshold. When a read is performed on a solid state storage system, one or more thresholds are used to perform the read. For example, in single-level cell (SLC) systems (where a cell stores a single bit), a single threshold is used to perform a read. If a given cell has a voltage which is less than the threshold, then a value of 1 (for example) is read. If the voltage stored by the cell is greater than the threshold, then a value of 0 (for example) is read. The threshold which returns the fewest bit errors (e.g., when the read-back bit sequence is compared to the correct or actual bit sequence) is referred to as the optimal threshold and the process of FIG. 1 estimates the value of the optimal threshold.

At 100, a bit flip count is determined for each bin in a plurality of bins, including by: (1) performing a first read on a group of solid state storage cells at a first threshold that corresponds to a lower bound for a given bin, (2) performing a second read on the same group of solid state storage cells at a second threshold that corresponds to an upper bound for the given bin. The bit flip count is calculated based on the read back values from the first read at (1) and the second read at (2).

Figure 2:
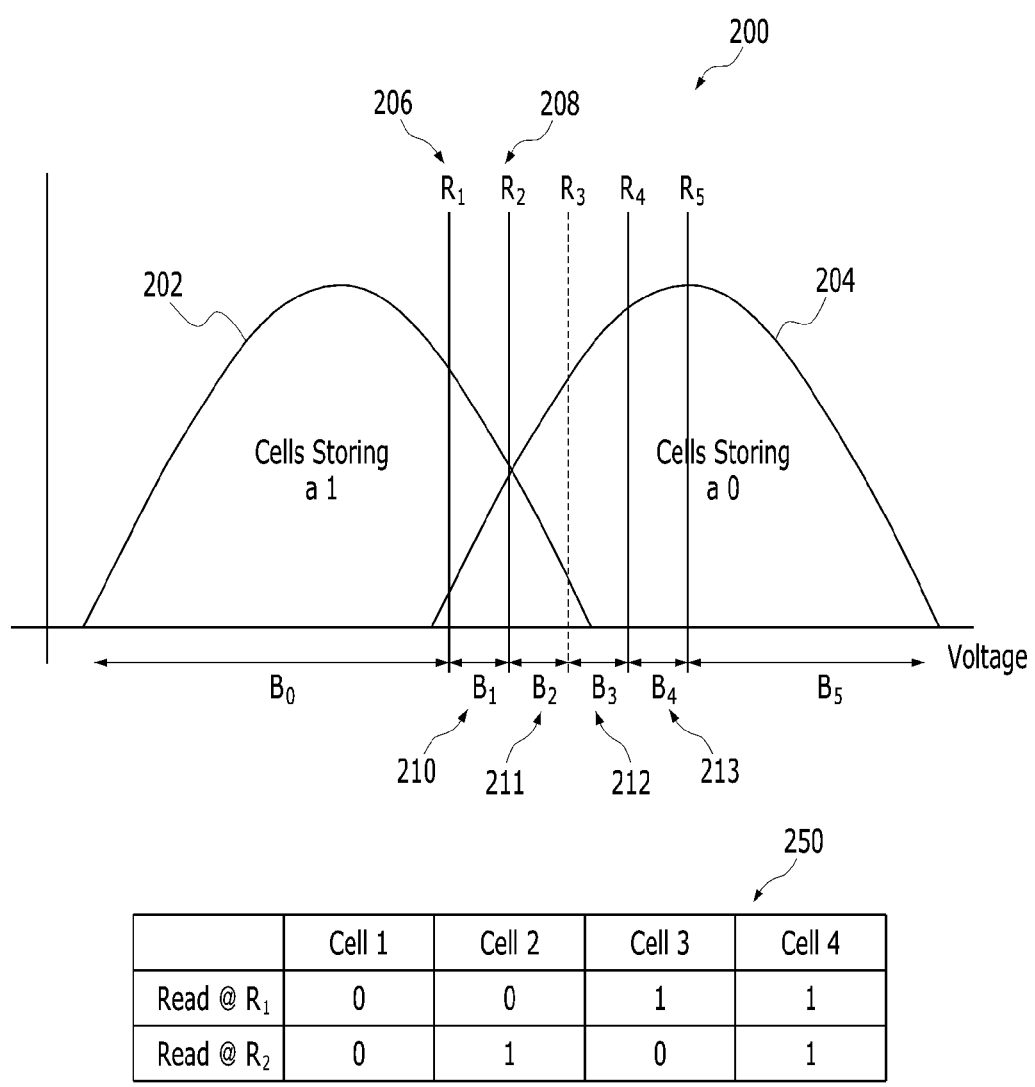
FIG. 2 is a diagram showing an embodiment of SLC distributions.

See, for example, FIG. 2, which is a diagram showing an embodiment of SLC distributions. The process of FIG. 1 may be performed here in order to estimate the voltage at which distribution 202 and distribution 204 intersect (e.g., since the optimal threshold corresponds to the voltage at which two distributions intersect). In diagram 200, distribution 202 corresponds to cells (actually) storing a 1 and distribution 204 corresponds to cells (actually) storing a 0. Naturally, any bit mapping may be used and the bit mappings described herein are merely exemplary. It is noted that distributions 202 and 204 in FIG. 2 are not known to the process of FIG. 1 but are shown to illustrate the technique.

In diagram 200, for each of bins $B_1$-$B_4$ (210-213), a corresponding bit flip count would be determined. To determine the bit flip count for bin $B_1$ (210), a first read is performed at threshold voltage $R_1$ (206) and a second read is performed at threshold voltage $R_2$ (208). If any of the bits flip (i.e., change) between the read at threshold voltage $R_1$ (206) and threshold voltage $R_2$ (208), then the bit flip count is incremented.

Diagram 250 shows exemplary read-back bit sequences which are returned by the reads at threshold voltage $R_1$ (206) and threshold voltage $R_2$ (208). In this example, the group of cells being read contains four cells. The read-back values for cells 1 and 4 are consistently a 0 and a 1, respectively, and thus do not correspond to bit flips and the bit flip count is not incremented.

In some embodiments, only plausible or expected bit flips are counted at step 100 in FIG. 1. For example, consider the read-back values of cell 2 in diagram 250. Since a value of 0 is returned by the read of cell 2 at threshold voltage $R_1$ (206), it can be inferred that cell 2 is storing a voltage which is greater than $R_1$ (i.e., stored_voltage$_{cell\_2}$>$R_1$). The read of cell 2 at threshold voltage $R_2$ (208) returned a 1, which corresponds to cell 2 storing a voltage which is less than $R_2$ (i.e., stored_voltage$_{cell\_2}$<$R_2$). These two inequalities are not incompatible, since the range $R_1$<stored_voltage$_{cell\_2}$<$R_2$ satisfies both inequalities. This is one example of a plausible bit flip.

In contrast, the bit flip shown by cell 3 is implausible. A returned value of 1 at threshold voltage $R_1$ corresponds to a stored voltage which is less than $R_1$ (i.e., stored_voltage$_{cell\_3}$<$R_1$). However, the returned value of 0 at threshold voltage $R_2$ corresponds to a stored voltage which is greater than $R_2$ (i.e., stored_voltage$_{cell\_3}$>$R_2$). There is no value of stored_voltage$_{cell\_3}$ which satisfies both inequalities because something cannot be both less than $R_1$ and greater than $R_2$. This is one example of an implausible bit flip and in some embodiments such implausible bit flips are not counted at step 100 in FIG. 1.

Oftentimes, implausible bit flips are due to read noises and if two threshold voltages (e.g., $R_1$ and $R_2$) are sufficiently separated implausible bit flips will not occur. Therefore, in some embodiments, there is no differentiation between the plausible and implausible bit flips. All the bit flips are counted in such embodiments.

Returning to FIG. 1, at 102, a minimum is determined using the bit flip counts corresponding to the plurality of bins. At 104, the minimum is used to estimate an optimal threshold. Some detailed examples of steps 102 and 104 are described below.

Although the subscript numbering of placed thresholds (i.e., $R_1, R_2, \ldots, R_5$) shown in FIG. 2 and other figures may imply a certain sequence or ordering of reads (e.g., from left to right), this is not a requirement. Any sequence or ordering of reads may be performed. For example, the read at threshold voltage $R_2$ (208) may be performed first and the read at threshold voltage $R_1$ (206) may be performed second if desired.

The following figure shows an example of a system which performs the process of FIG. 1.

Figure 3:
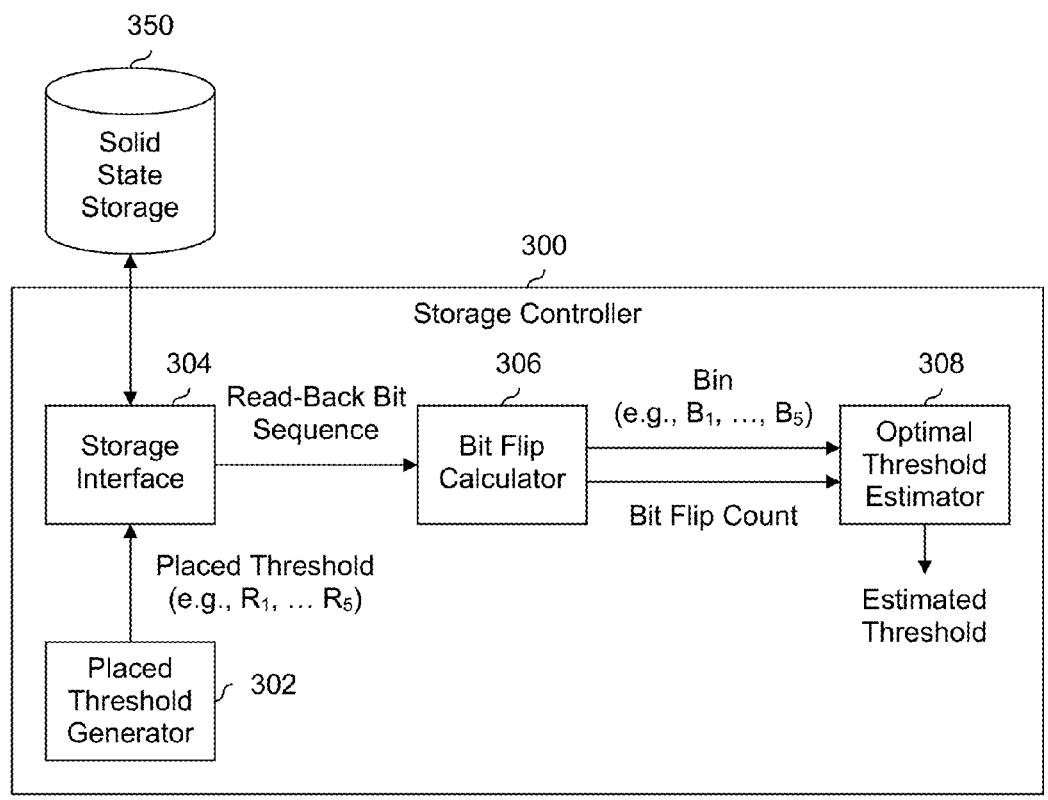
FIG. 3 is a diagram illustrating an embodiment of a storage controller which performs optimal threshold estimation.

FIG. 3 is a diagram illustrating an embodiment of a storage controller which performs optimal threshold estimation. In some embodiments, storage controller 300 is implemented on a semiconductor device, such as an application-specific integrated circuit (ASIC) or a field-programmable gate array (FPGA). In some embodiments, storage controller 300 comprises a first semiconductor device (i.e., a first "chip") and solid state storage 350 comprises a second semiconductor device (i.e., a second "chip"). In some embodiments, a single storage controller manages multiple "chips" of solid state storage.

In the example shown, placed threshold generator 302 generates placed thresholds. Using diagram 200 in FIG. 2 as an example, placed threshold generator 302 generates placed thresholds $R_1, \ldots, R_5$. In some embodiments, placed threshold generator 302 includes one or more programmable bin parameters which are used to generate the placed thresholds. In one example, the bin parameters include a bin width ($\Delta$, a number of bins to generate (N), and a default threshold ($R_{default}$). For example, if $\Delta=10$, N=5, and $R_{default}=78$, then placed thresholds at 53, 63, 73, 83, 93, and 103 would be generated. The exemplary placed thresholds correspond to 5 bins, each with a width of 10 units, where the center bin (i.e., the [73, 83] bin) has a center at the default threshold of 78.

Storage interface 304 receives the placed thresholds from placed threshold generator 302 and performs reads on solid state storage 350 using the placed thresholds. In one example, solid state storage 350 comprises NAND Flash. In various embodiments, solid state storage 350 includes SLC storage where a cell stores 1 bit, multi-level cell (MLC) storage where a cell stores 2 bits, or tri-level cell (TLC) storage where a cell stores 3 bits. In some embodiments, solid state storage 350 includes multiple types of storage (e.g., SLC storage as well as MLC storage).

Storage interface 304 passes the read-back bit sequences to bit flip calculator 306. Diagram 250 in FIG. 2 shows one example of read-back bit sequences. Bit flip calculator 306 calculates the bit flip count for each bin and passes the bins (e.g., $B_1, \ldots, B_5$) and corresponding bit flip counts to optimal threshold estimator 308.

Optimal threshold estimator 308 in turn generates an estimated threshold, including by determining a minimum. In a first example described below, a minimum bin (which corresponds to the bin having the lowest bit flip count) is selected and is used to generate the estimated threshold. In a second example described below, a curve is fitted to data points (e.g., corresponding to or otherwise based on the bit flip counts) and the minimum of the fitted curve is used to estimate the optimal threshold.

Figure 4:
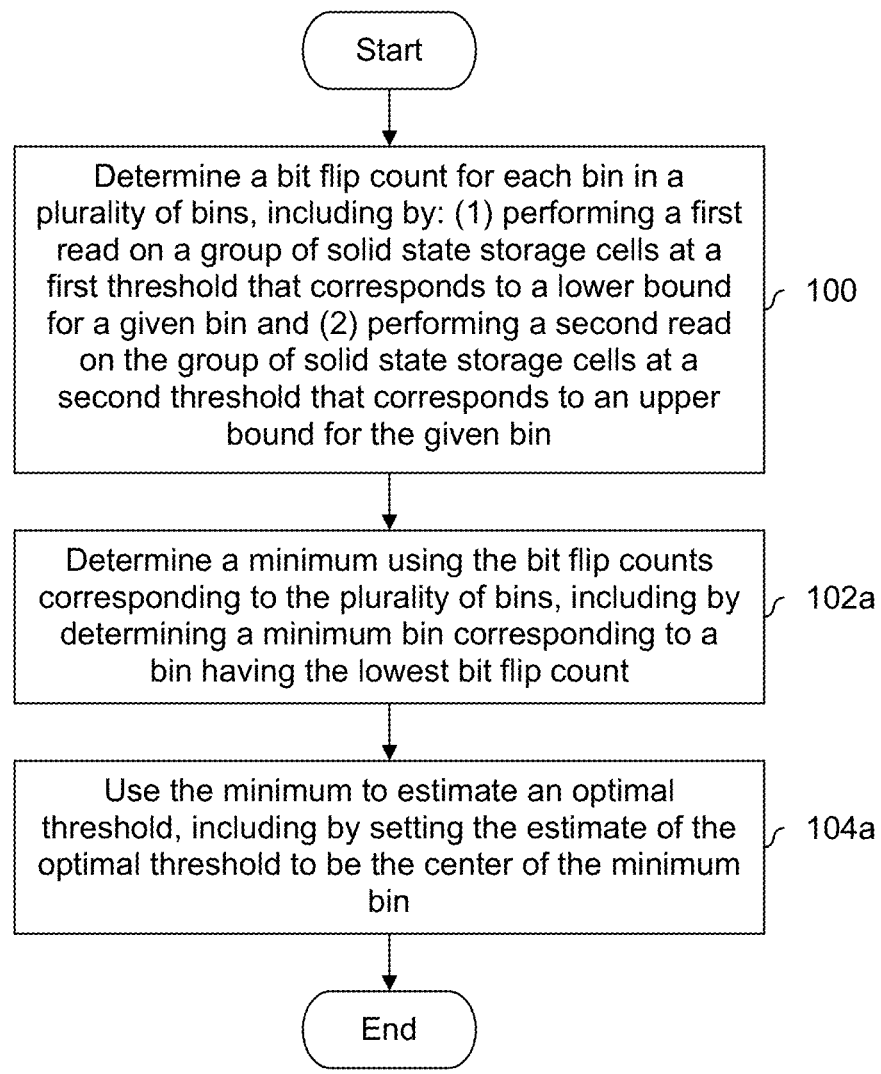
FIG. 4 is a flowchart illustrating an embodiment of a process for estimating an optimal threshold using a minimum bin.

FIG. 4 is a flowchart illustrating an embodiment of a process for estimating an optimal threshold using a minimum bin. At 100, a bit flip count is determined for each bin in a plurality of bins, including by: (1) performing a first read on a group of solid state storage cells at a first threshold that corresponds to a lower bound for a given bin and (2) performing a second read on the group of solid state storage cells at a second threshold that corresponds to an upper bound for the given bin.

Figure 5:
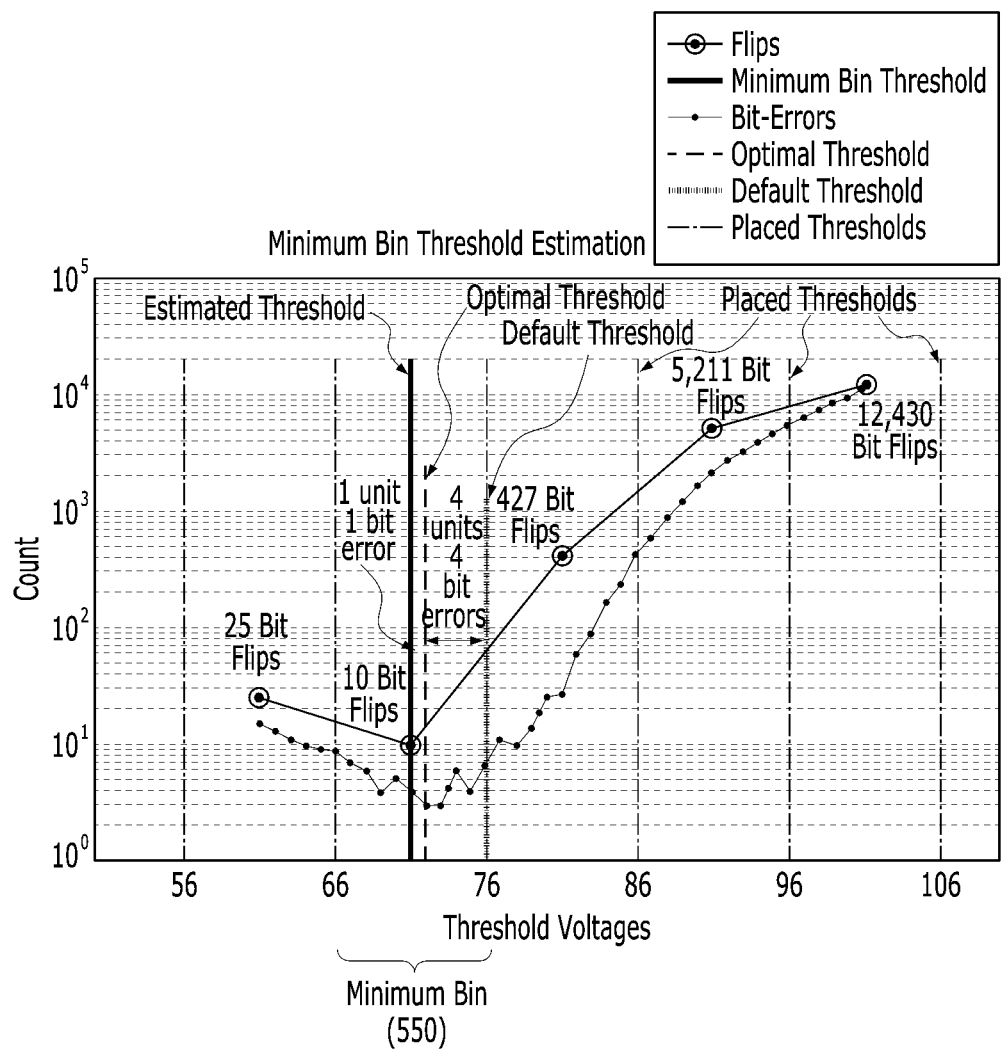
FIG. 5 is a diagram illustrating an embodiment of a minimum bin which is used to estimate an optimal threshold.

At 102a, a minimum is determined using the bit flip counts corresponding to the plurality of bins, including by determining a minimum bin corresponding to a bin having the lowest bit flip count. FIG. 5 is a diagram illustrating an embodiment of a minimum bin which is used to estimate an optimal threshold. In diagram 500 there are five bins: the [56, 66] bin with 25 bit flips, the [66, 76] bin with 10 bit flips, the [76, 86] bin with 427 bit flips, the [86, 96] bin with 5,211 bit flips, and the [96, 106] bin with 12,430 bit flips. In this example, the bin with the lowest bit flip count (i.e., the minimum bin) is the [66, 76] bin (550).

Returning to FIG. 4, at 104a, the minimum is used to estimate an optimal threshold, including by setting the estimate of the optimal threshold to be the center of the minimum bin. For example, in FIG. 5, the minimum bin (550) is the [66, 76] bin, which has its center at 71 units. As such, the estimated threshold is set to 71 units in this example.

As is shown in diagram 550 in FIG. 5, the estimated threshold is a better threshold than the default threshold. The estimated threshold is 1 threshold voltage unit away from the actual optimal threshold, whereas the default threshold is 4 units away from the actual optimal threshold. Similarly, the estimated threshold returns fewer bit errors compared to the default threshold (i.e., only 1 bit error versus 4 bit errors).

Figure 6:
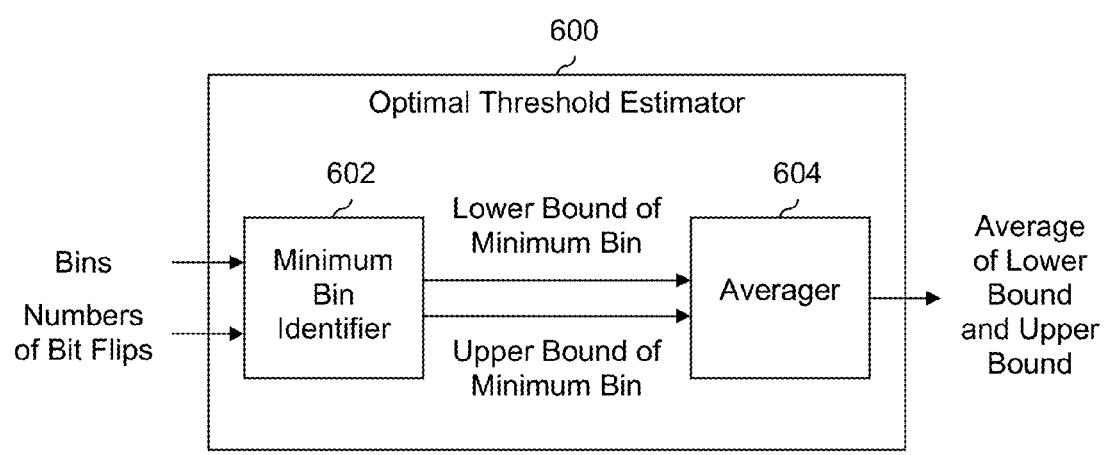
FIG. 6 is a diagram illustrating an embodiment of an optimal threshold estimator which uses a minimum bin to generate an estimate.

FIG. 6 is a diagram illustrating an embodiment of an optimal threshold estimator which uses a minimum bin to generate an estimate. In some embodiments, optimal threshold estimator 308 in FIG. 3 is implemented as shown.

In the example shown, optimal threshold estimator 600 includes minimum bin identifier 602. In this example, minimum bin identifier 602 selects the lowest bit flip count input to it (e.g., 10 bit flips in FIG. 5) and then determines the corresponding bin (e.g., the [66, 76] bin in FIG. 5). The lower bound and the upper bound of the minimum bin (e.g., 66 and 76 in FIG. 5) are then passed from minimum bin identifier 602 to averager 604. Minimum bin identifier 602 is one example of a component which performs step 102a in FIG. 4.

Averager 604 performs an average on the lower bound and upper bound of the minimum bin; the result is output as the estimated threshold. Averager 604 is one example of a component which performs step 104a in FIG. 4.

As described above, another way of estimating an optimal threshold is to use a fitted curve. The following figures describe an example of this.

Figure 7:
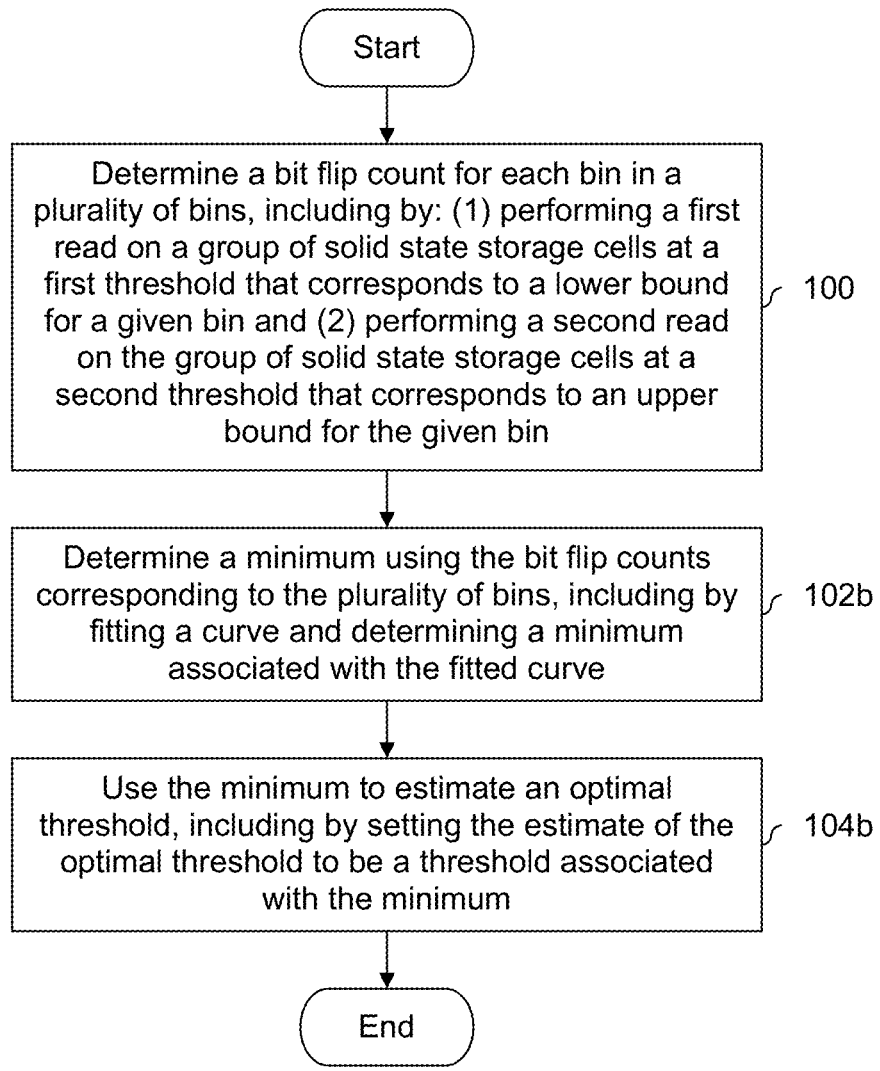
FIG. 7 is a flowchart illustrating an embodiment of a process for estimating an optimal threshold using a fitted curve.

FIG. 7 is a flowchart illustrating an embodiment of a process for estimating an optimal threshold using a fitted curve. At 100, a bit flip count is determined for each bin in a plurality of bins, including by: (1) performing a first read on a group of solid state storage cells at a first threshold that corresponds to a lower bound for a given bin and (2) performing a second read on the group of solid state storage cells at a second threshold that corresponds to an upper bound for the given bin.

At 102b, a minimum is determined using the bit flip counts corresponding to the plurality of bins, including by fitting a curve and determining a minimum associated with the fitted curve. The following figure shows one example of a fitted curve.

Figure 8:
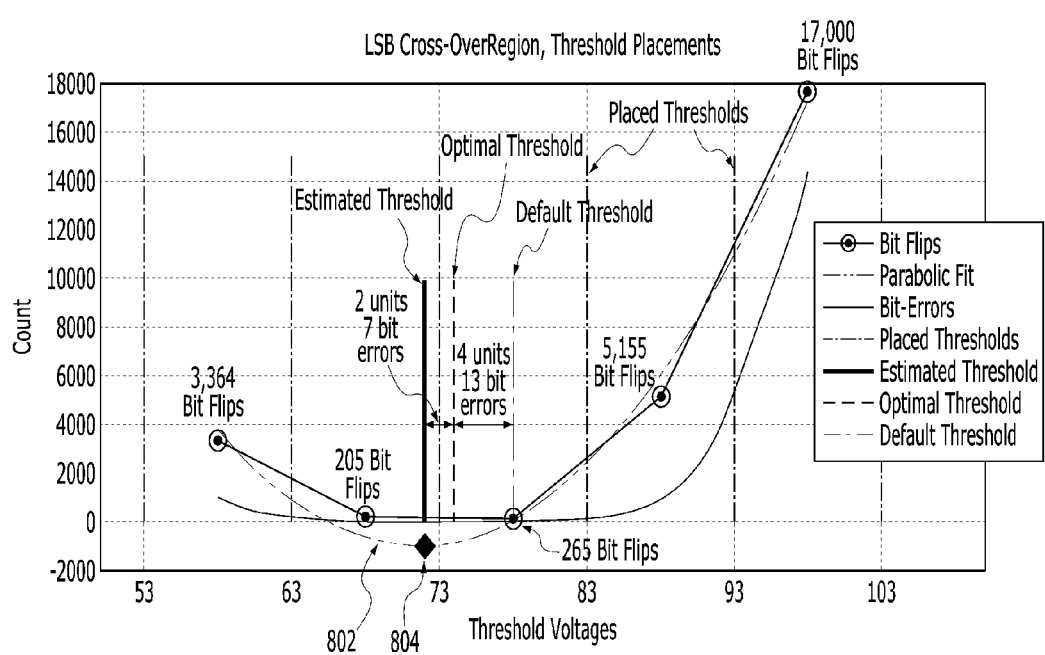
FIG. 8 is a diagram illustrating an embodiment of a fitted curve which is used to estimate an optimal threshold.

FIG. 8 is a diagram illustrating an embodiment of a fitted curve which is used to estimate an optimal threshold. In diagram 800, the five data points to which a curve is fitted are: (58, 3364), (68, 205), (78, 265), (88, 5155), and (98, 17000) where the x-coordinates of the data points correspond to the centers of the bins and the y-coordinates of the data points correspond to the bit flip count.

In this example, a quadratic function (i.e., $y=ax^2+bx+c$) is fitted to the data points using a Least Squares fit. This produces the quadratic coefficients: a=24.8843, b=−3559.7, and c=1.26×10$^5$. Diagram 800 shows the fitted curve (802) corresponding to those coefficients. Fitted curve 802 includes minimum 804.

Returning to FIG. 7, at 104b, the minimum is used to estimate an optimal threshold, including by setting the estimate of the optimal threshold to be a threshold associated with the minimum. For example, in diagram 800 in FIG. 8, the x-coordinate of minimum 804

$$x_{min} = -\frac{b}{2a} = -\frac{(-3559.7)}{2(24.8843)} = 71.52.$$

In this example, this is rounded to 72.

As is shown in diagram 800, the estimated threshold is better than the default threshold according to a number of metrics. For example, using distance from the optimal threshold as a metric, the estimated threshold is closer to the optimal threshold (a difference of two units of threshold voltage) compared to the default threshold, which is off by 4 units. If the number of bit errors returned by a given threshold is used as a metric, the estimated threshold returns 7 bit errors whereas the default threshold returns 13 bit errors compared to the actual data.

As described above, one problem with some other techniques is that in some cases they get stuck and/or converge on a threshold which could be improved upon. For example, one other technique uses a gradient descent technique to estimate the optimal threshold. However, in some cases, the gradient descent technique gets stuck in a local minimum which is not the global minimum. One benefit of fitting a quadratic function to the data points is that a quadratic function only has a single minimum, which (as a result of the curve fitting) is likely to be near the actual optimal threshold. It is thus impossible to accidentally select or converge towards the wrong minimum using a quadratic function since there is only 1 minimum.

Figure 9:
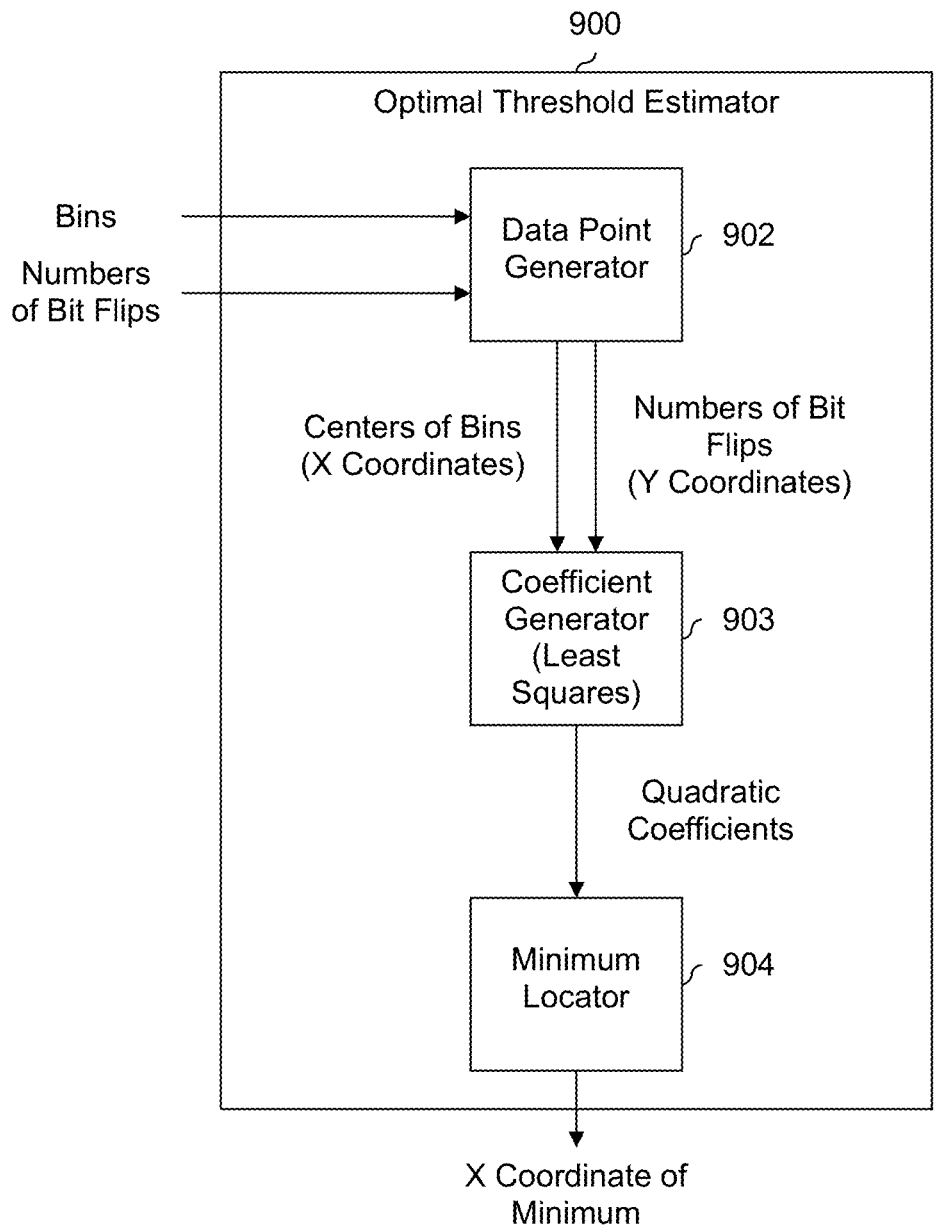
FIG. 9 is a diagram illustrating an embodiment of an optimal threshold estimator which fits a curve to data points in order to generate the estimate.

FIG. 9 is a diagram illustrating an embodiment of an optimal threshold estimator which fits a curve to data points in order to generate the estimate. In some embodiments, optimal threshold estimator 308 in FIG. 3 is implemented as shown.

Optimal threshold estimator 900 includes data point generator 902 which generates data points from the bins and bit flip counts which are input to it. The x coordinates generated by data point generator 902 are the centers of the bins and the y coordinates generated by data point generator 902 are the bit flip counts. For example, if the bin values input to data point generator 902 do not already include the lower bound and upper bound for each bin, then data point generator 902 obtains the two bounds and averages them for each bin to obtain the x coordinate.

Coefficient generator 903 uses the data points to generate quadratic coefficients. As described above, in this example, a Least Squares fit is used to fit the curve. In some other embodiments, some other technique for fitting a curve (i.e., besides Least Squares) is used. Coefficient generator 903 is one example of a component which fits a curve at step 102b in FIG. 7.

Minimum locator 904 uses the quadratic coefficients to find the minimum of the fitted curve. It is the x-coordinate of the minimum that is of interest, so minimum locator 904 uses the equation $$x_{min} = -\frac{b}{2a}$$

to generate the x-coordinate of the minimum. (Naturally, if some other type of curve were fitted to the data points then another equation to calculate $x_{min}$ would be used.) The x-coordinate of the minimum is then output as the estimate of the optimal threshold. Minimum locator 904 is one example of a component which determines a minimum at step 102b in FIG. 7.

As described above, solid state storage may include SLC storage (i.e., 1 bit of storage per cell), MLC storage (i.e., 2 bits of storage per cell), TLC storage (i.e., 3 bits of storage per cell), etc. The techniques described above are applicable to higher density storage, such as MLC and TLC, and the following figures show some examples of this. First, an MLC example is described. This is followed by a TLC example.

Figure 10:
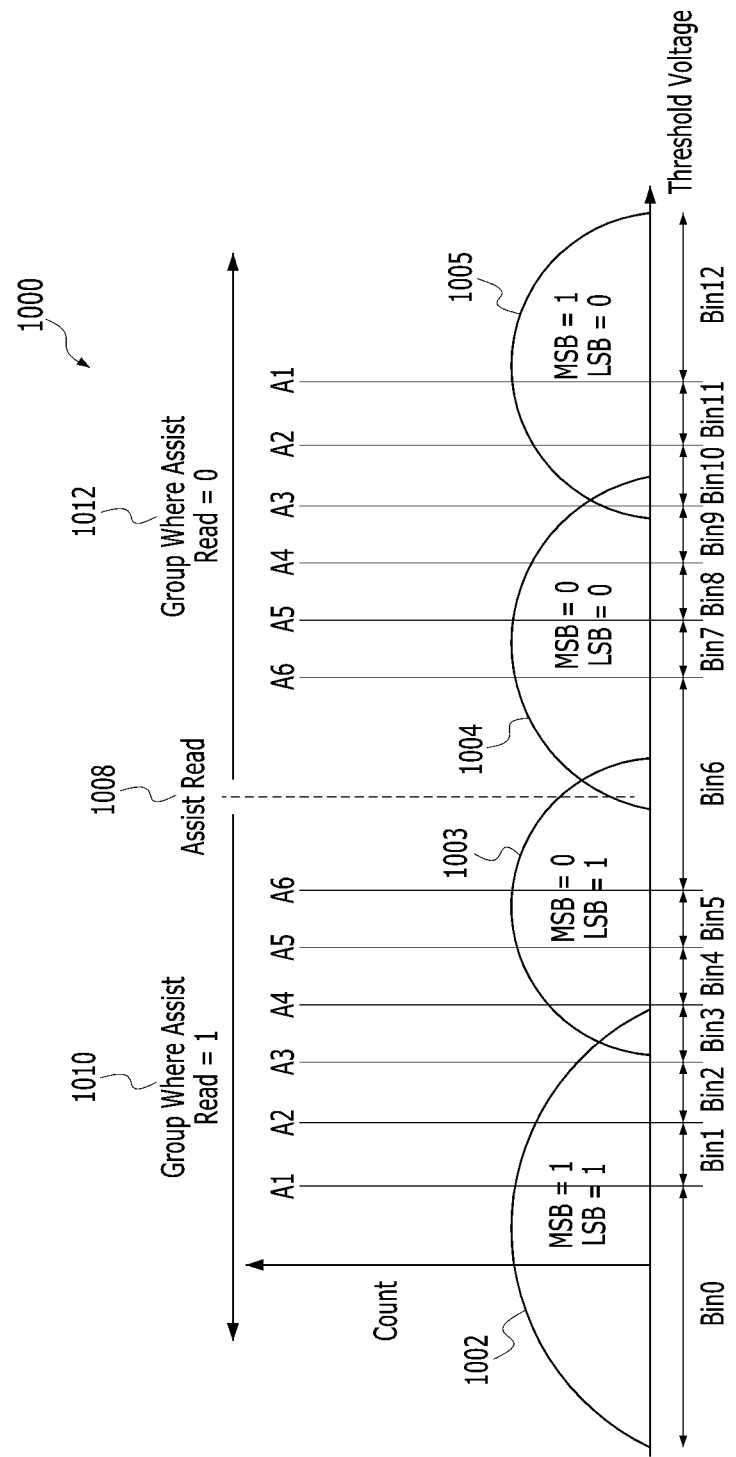
FIG. 10 is a diagram illustrating an embodiment of an assist read performed on MLC storage.

FIG. 10 is a diagram illustrating an embodiment of an assist read performed on MLC storage. In diagram 1000, distribution 1002 corresponds to cells storing a most significant bit (MSB) of 1 and a least significant bit (LSB) of 1. In distribution 1003, the cells store an MSB of 0 and an LSB of 1; in distribution 1004, the cells store an MSB of 0 and an LSB of 0; in distribution 1005, the cells store an MSB of 1 and an LSB of 0.

An optimal threshold estimation process which is performed on MLC storage will generate three estimates: one for the A threshold, one for the B threshold, and one for the C threshold. The optimal A threshold corresponds to the threshold voltage at which distributions 1002 and 1003 intersect; the optimal B threshold corresponds to the threshold voltage at which distributions 1003 and 1004 intersect; the optimal C threshold corresponds to the threshold voltage at which distributions 1004 and 1005 intersect.

In MLC storage, the B threshold (e.g., at or near assist read 1008) is used to read the LSB. Cells having a voltage less than the specified B threshold are read as having an LSB of 1. Cells having a voltage greater than the specified B threshold are read as having an LSB of 0. This is the same as the SLC examples described above and so the examples described above are applicable in a straightforward manner to the estimation of the optimal B threshold used to read the LSB. As such, it is not repeated here for brevity.

The process of estimating the optimal A threshold and the optimal C threshold is not as straightforward. In this example, the process begins with an assist read at threshold voltage 1008. In embodiments described herein, an assist read comprises an SLC assist read. In other words, the controller reads the storage as if it were SLC storage (e.g., even if the storage is actually MLC storage or TLC storage). To put it another way, an assist read uses only a single threshold voltage when performing a read, which is a characteristic of reading SLC storage.

During the assist read at 1008, cells which have a voltage less than the threshold voltage of the assist read (1008) are read as a 1 and cells which have a voltage greater than the threshold voltage of the assist read are read as a 0. Cells which are read as a 0 are grouped into one group (1012) and cells which are read as a 1 are grouped into another group (1010). The cells in group 1010 are then used to estimate the optimal A threshold (i.e., for the MSB of the MLC storage) between distributions 1002 and 1003 and the cells in group 1012 are used to estimate the optimal C threshold (i.e., for the MSB of the MLC storage) between distributions 1004 and 1005. This is described in further detail below.

It is noted that cells in distribution 1003 which have a voltage greater than the threshold voltage of assist read 1008 will be misread (i.e., a 0 instead of 1) and cells in distribution 1004 which have a voltage less than the threshold voltage of assist read 1008 will also be misread (i.e., a 1 instead of 0). Since distributions 1003 and 1004 overlap, it is impossible to avoid misreads. However, the misreads around the assist read will not affect the optimal threshold estimation as long as the misread bits keep the same value for all the A reads or C reads. In another words, if the tail of distribution 1003 does not cross $C_1$, C threshold estimation will not be affected. Similarly, if the tail of distribution 1004 does not cross $A_6$, A threshold estimation will not be affected either. In any case, the estimation technique(s) described herein work to an acceptable degree even with the misreads.

In some embodiments, the threshold voltage of the assist read is set to some nominal or typical voltage associated with the intersection of distribution 1003 and distribution 1004. In some embodiments, the threshold voltage of the assist read is set to some midpoint between the placed thresholds which will be simultaneously changing (e.g., the midpoint between the A and C placed thresholds).

The following figure shows exemplary bit sequences which are read back from the MLC storage and continues the example shown here.

Figure 11:
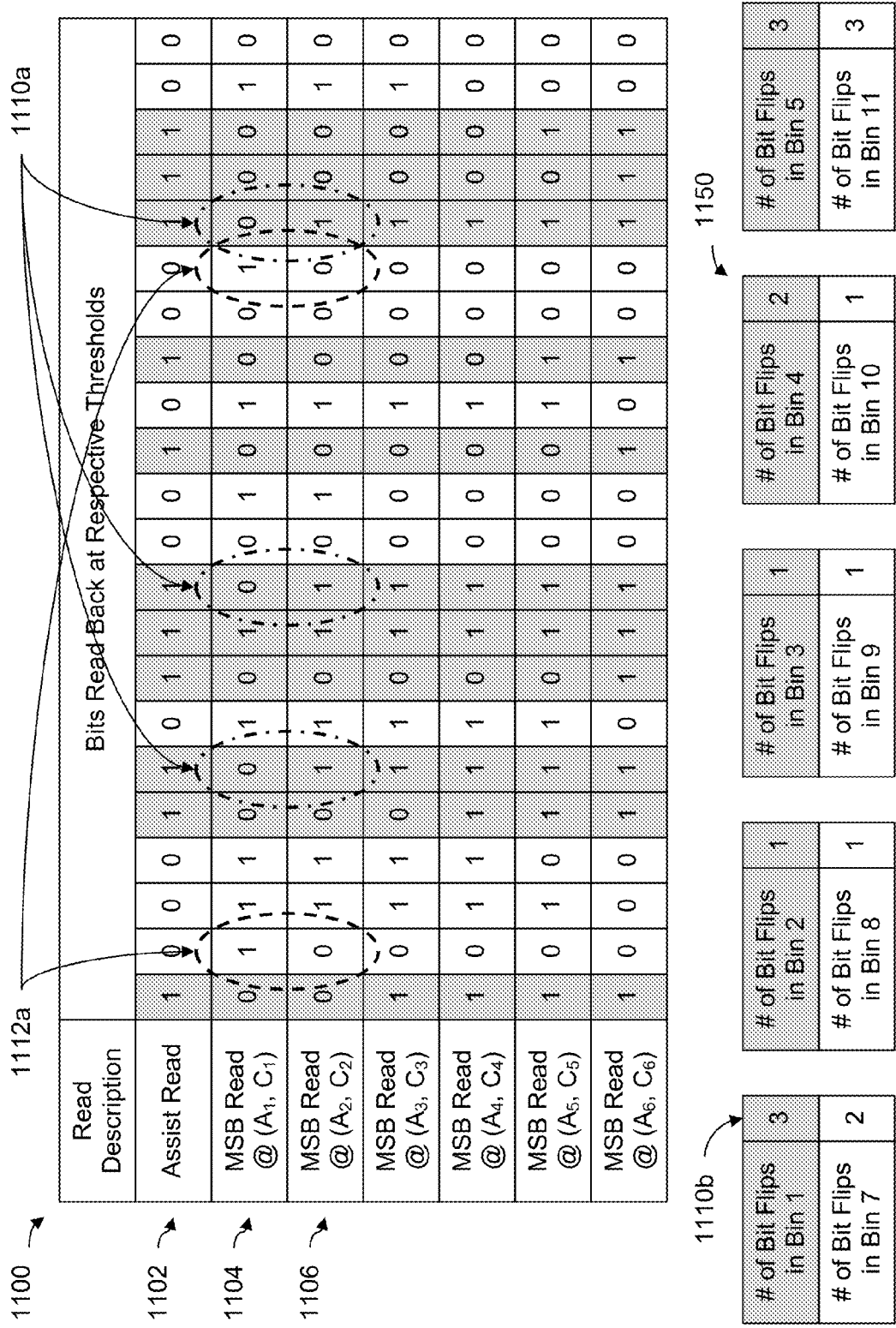
FIG. 11 is a diagram showing an embodiment of read-back bit sequences from MLC storage.

FIG. 11 is a diagram showing an embodiment of read-back bit sequences from MLC storage. Diagram 1100 shows 7 read-back bit sequences, the first of which is from the assist read (1102). As described above, the read-back bit sequence from the assist read is used to divide up the cells into two groups. The cells which are read as a 1 during the assist read are used to estimate the optimal A threshold (but not the optimal C threshold) and are shown in FIG. 11 in grey columns. The cells which are read as a 0 during the assist read are used to estimate the optimal C threshold (but not the optimal A threshold) and are shown in FIG. 11 in white columns.

After the assist read is performed, 6 MSB reads are performed at $(A_1, C_1), \ldots, (A_6, C_6)$. During an MSB read, cells which store a voltage between the two specified threshold voltages (e.g., between $A_1$ and $C_1$, or between $A_2$ and $C_2$) are read as having an MSB of 0. Cells which store a voltage less than the lower threshold voltage (e.g., less than $A_1$) or greater than the higher threshold voltage (e.g., greater than $C_1$) are read as having an MSB of 1.

Diagram 1150 shows the bit flip counts corresponding to bins 1-5 and 7-11 (see, e.g., FIG. 10). To illustrate how the bit flip counts are determined, consider read-back bit sequence 1104 (resulting from the MSB read at $(A_1, C_1)$) and read-back bit sequence 1106 (resulting from the MSB read at $(A_2, C_2)$). Bit flips which occur in grey-colored columns between row 1104 and 1106 (i.e., bit flips 1110a) are counted towards bit flip count 1110b corresponding to bin 1. Bit flips which occur in white-colored columns between rows 1104 and 1106 (i.e., bit flips 1112*a*) are counted towards bit flip count 1112*b* corresponding to bin 7. Bit flip counts for bins 2-5 and 8-11 are counted in a similar manner.

Once the bit flip counts have been determined for bins 1-5 and 7-11, the techniques described above may be used to estimate the optimal A threshold and the optimal C threshold. For example, the process of FIG. 1 may be performed once on bins 1-5 and their corresponding bit flip counts in order to estimate the optimal A threshold, and then again on bins 7-11 and their corresponding bit flip counts in order to estimate the optimal C threshold.

As described above, there is a cost associated with not using an assist read. Specifically, more reads would have to be performed in order to obtain the bit flip counts. Without the assist read, the A threshold would have to be held constant while the C threshold is varied and vice versa. Using the thresholds shown in diagram 1000 of FIG. 10 this corresponds to: a $1^{st}$ read at ($A_{constant}$, $C_1$), a $2^{nd}$ read at ($A_{constant}$, $C_2$), . . . , and a $6^{th}$ read at ($A_{constant}$, $C_6$). Then, the A threshold would be varied while the C threshold is held constant: a $7^{th}$ read at ($A_1$, $C_{constant}$), an $8^{th}$ read at ($A_2$, $C_{constant}$), . . . , and a $12^{th}$ read at ($A_6$, $C_{constant}$). This is because if both thresholds were varied simultaneously without performing an assist read, it would not be known if a given bit flip occurred because the A threshold changed or the C threshold changed. Hence, without an assist read, 12 reads would be required instead of 7 reads in this example.

This technique of using an (SLC) assist read to estimate optimal thresholds also applies to TLC storage. The following figures describe one such TLC example.

Figure 12A:
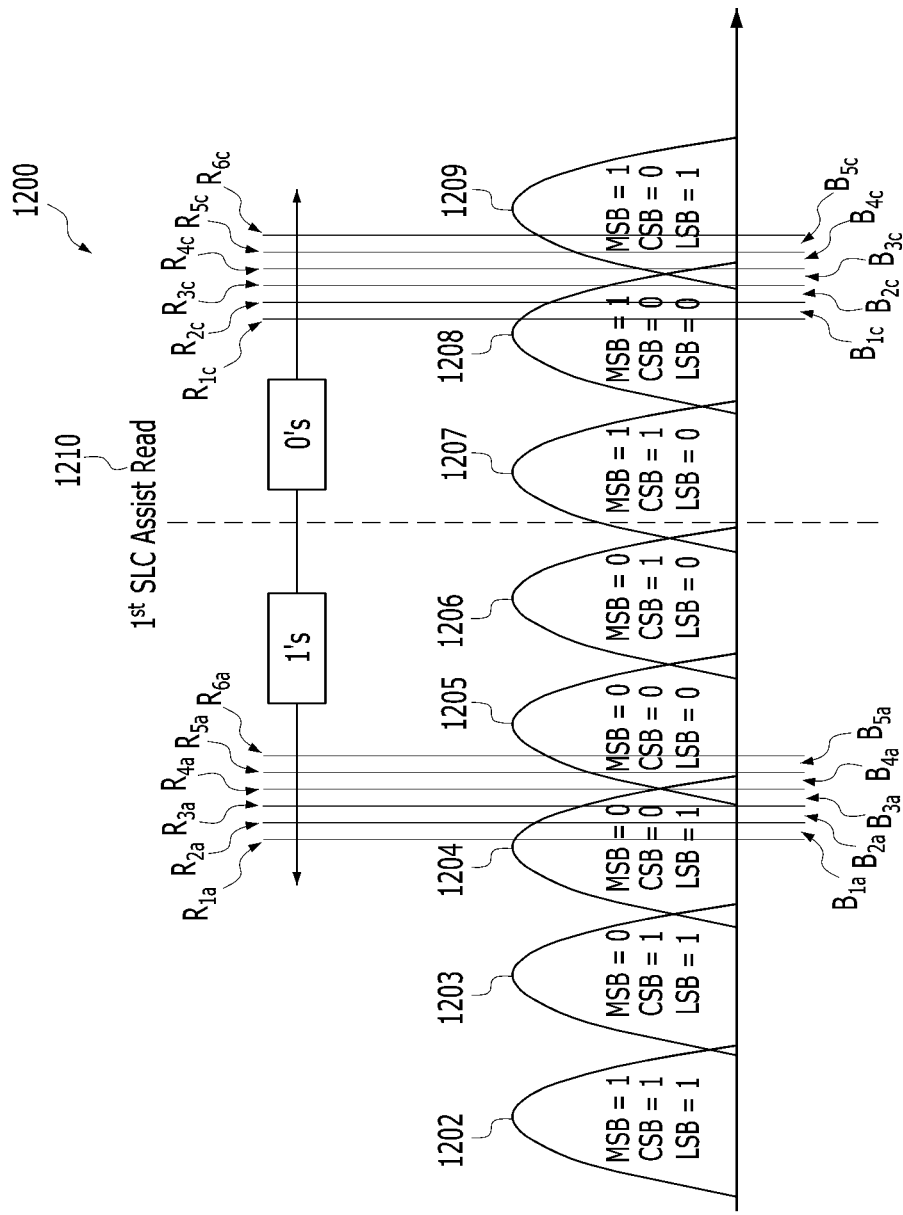
FIG. 12A is a diagram illustrating an embodiment of a first SLC assist read, where the assist read is used to estimate optimal thresholds for the LSB.

FIG. 12A is a diagram illustrating an embodiment of a first SLC assist read, where the assist read is used to estimate optimal thresholds for the LSB. In the example shown, the storage comprises TLC storage where each cell stores 3 bits. Diagram 1200 shows the 8 distributions associated with the 8 possible 3-bit values which may be stored by a cell. Distribution 1202 is associated with cells which store an MSB of 1, a center significant bit (CSB) of 1, and an LSB of 1. (For brevity, a bit sequence of XYZ will mean an LSB of X, a CSB of Y, and an MSB of Z.) Distribution 1203 is associated with cells which store a 110, distribution 1204 is associated with cells which store a 100, distribution 1205 is associated with cells which store a 000, distribution 1206 is associated with cells which store a 010, distribution 1207 is associated with cells which store a 011, distribution 1208 is associated with cells which store a 001, and distribution 1209 is associated with cells which store a 101.

In diagram 1200, a first SLC assist read is performed at threshold voltage 1210. As described above, the assist read treats the storage as if it is SLC storage, even though it is actually TLC storage. For example, TLC storage is normally read with two or more threshold voltages: 2 threshold voltages must be specified when an LSB read is performed, 2 threshold voltages must be specified when an MSB read is performed, and 3 threshold voltages must be specified when a CSB read is performed. However, the assist read shown in diagram 1200 uses only one threshold voltage, which is a characteristic of reading SLC storage; this is why the assist reads are described herein as SLC assist reads.

Cells which are read as a 1 are grouped into one group which is used to estimate the optimal LSB threshold between distributions 1204 and 1205. Cells which are read as a 0 are grouped into another group which is used to estimate the optimal LSB threshold between distributions 1208 and 1209. In some embodiments, the threshold voltage of assist read 1210 is set to a nominal or default value associated with the intersection of distributions 1206 and 1207.

Once the cells have been divided up, 6 reads of the LSB are performed at ($R_{1a}$, $R_{1c}$), ($R_{2a}$, $R_{2c}$), ($R_{3a}$, $R_{3c}$), ($R_{4a}$, $R_{4c}$), ($R_{5a}$, $R_{5c}$), and ($R_{6a}$, $R_{6c}$). As described above, the assist read at threshold voltage 1210 permits the A threshold and the C threshold to be varied simultaneously which results in fewer total reads than without an assist read.

The reads of the LSB are used to calculate bit flip counts for bins $B_{1a}$-$B_{5a}$ and $B_{1c}$-$B_{5c}$, as described above. The bit flip counts for bins $B_{1a}$-$B_{5a}$ are used to estimate an optimal threshold for the LSB threshold between distributions 1204 and 1205; the bit flip counts for bins $B_{1c}$-$B_{5c}$ are used to estimate an optimal threshold for the LSB threshold between distributions 1208 and 1209. In some embodiments, a minimum bin may be used to estimate the optimal A or C threshold. In some embodiments, a curve fitting process is performed.

Figure 12B:
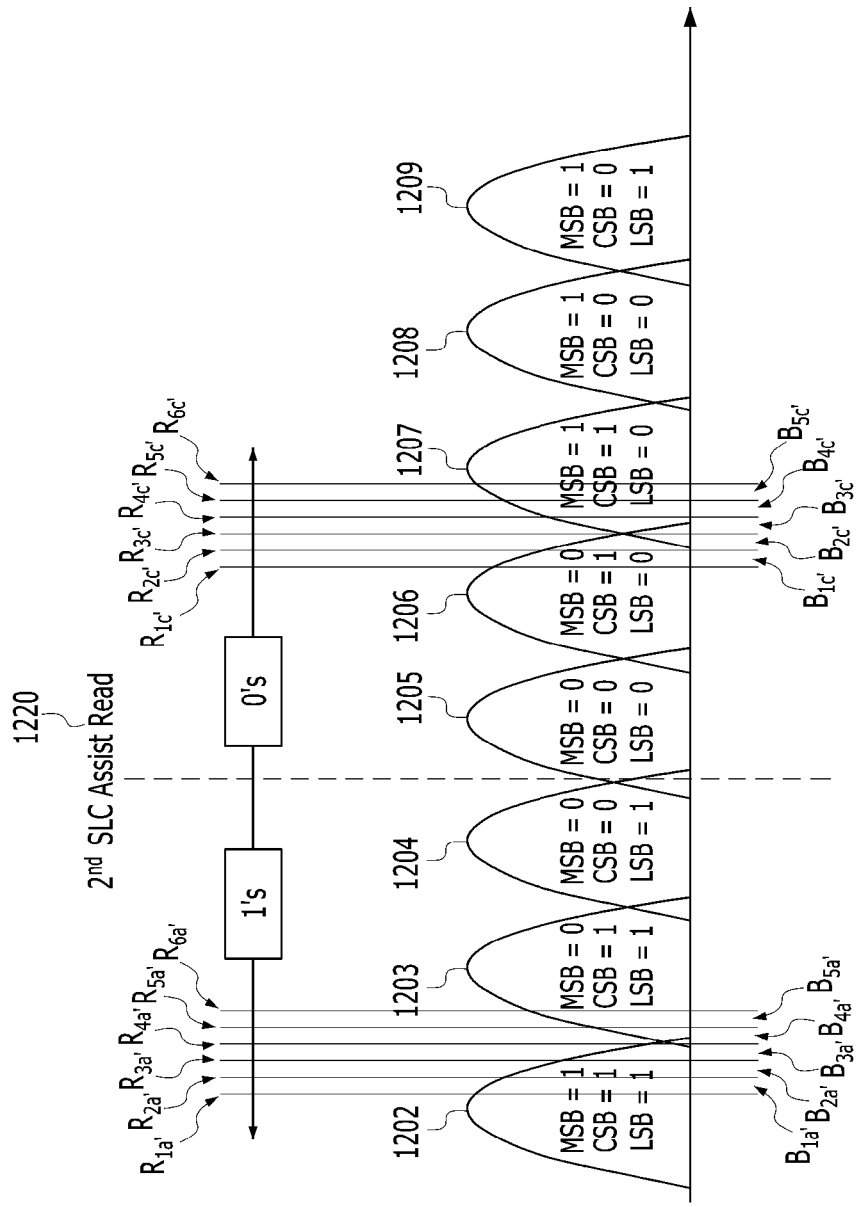
FIG. 12B is a diagram illustrating an embodiment of a second assist read, where the assist read is used to estimate optimal thresholds for the MSB.

FIG. 12B is a diagram illustrating an embodiment of a second assist read, where the assist read is used to estimate optimal thresholds for the MSB. In the example shown, a second assist read is performed at threshold voltage 1220 in order to divide the cells into two groups. Cells which are read as a 1 are grouped into a first group and cells which are read as a 0 are grouped into a second group.

Reads of the MSB are then performed at ($R_{1a'}$, $R_{1c'}$), ($R_{2a'}$, $R_{2c'}$), ($R_{3a'}$, $R_{3c'}$), ($R_{4a'}$, $R_{4c'}$), ($R_{5a'}$, $R_{5c'}$), and ($R_{6a'}$, $R_{6c'}$). The bit flip counts for bins $B_{1a'}$-$B_{5a'}$ are then used to estimate the optimal MSB threshold between distribution 1202 and 1203. Similarly, the bit flip counts for bins $B_{1c'}$-$B_{5c'}$ are used to estimate the optimal MSB threshold between distributions 1206 and 1207.

Figure 12C:
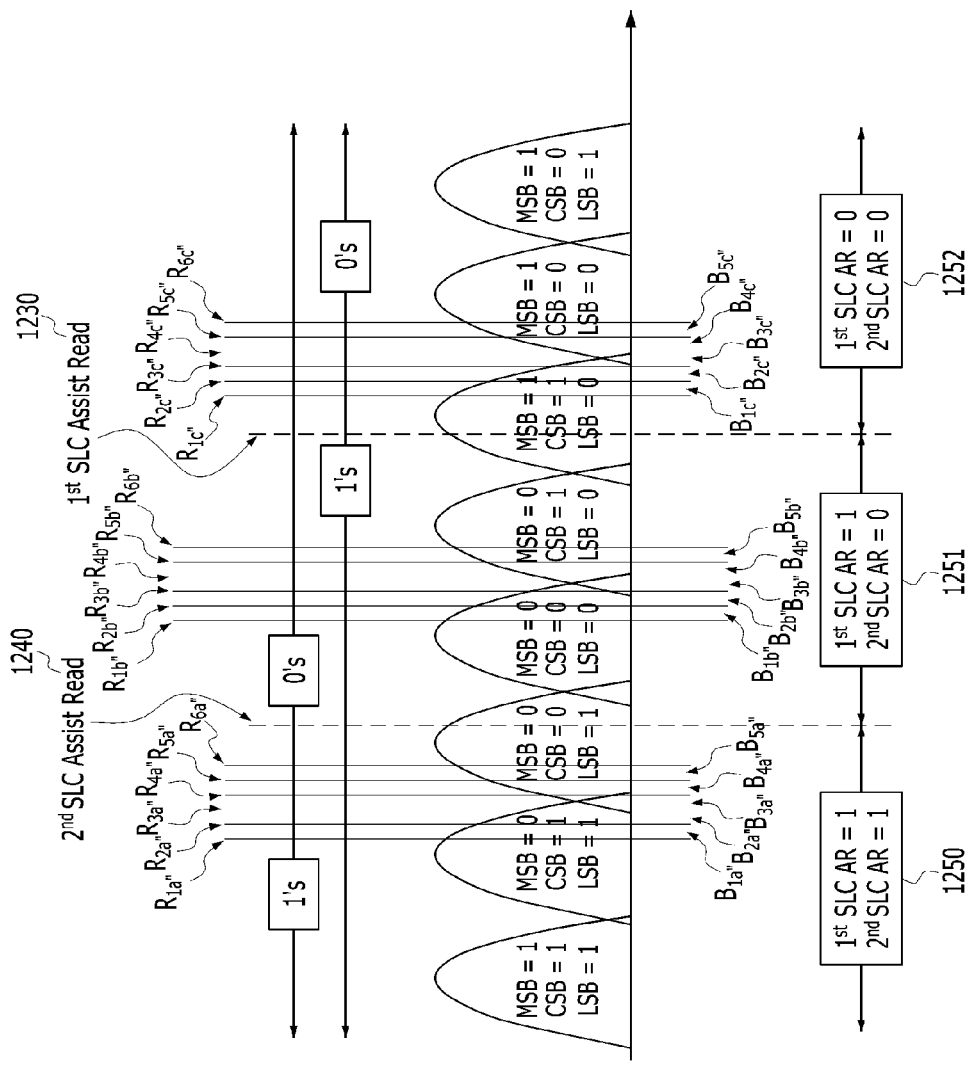
FIG. 12C is a diagram illustrating an embodiment of a first and second assist read, where the assist reads are used to estimate optimal thresholds for the CSB.

FIG. 12C is a diagram illustrating an embodiment of a first and second assist read, where the assist reads are used to estimate optimal thresholds for the CSB. In the example shown, a first SLC assist read at threshold voltage 1230 and a second SLC assist read at threshold voltage 1240 are used to divide the cells into 3 groups. One group (1250) corresponds to a first SLC assist read of 1 and a second SLC assist read of 1, a second group (1251) corresponds to a first SLC assist read of 1 and a second SLC assist read of 0, and a third group (1252) corresponds to a first SLC assist read of 0 and a second SLC assist read of 0.

With the cells divided into three groups, 6 CSB reads are performed at ($R_{1a''}$, $R_{1b''}$, $R_{1c''}$), ($R_{2a''}$, $R_{2b''}$, $R_{2c''}$), ($R_{3a''}$, $R_{3b''}$, $R_{3c''}$), ($R_{4a''}$, $R_{4b''}$, $R_{4c''}$), ($R_{5a''}$, $R_{5b''}$, $R_{5c''}$), and ($R_{6a''}$, $R_{6b''}$, $R_{6c''}$) in order to determine bit flip counts for bins $B_{1a''}$-$B_{5a''}$, bins $B_{1b''}$-$B_{5b''}$, and bins $B_{1c''}$-$B_{5c''}$. In a CSB read, a voltage less than the lowest threshold voltage (e.g., less than $R_{1a''}$) is read as a 1, a voltage between the lowest threshold voltage and the middle threshold voltage (e.g., between $R_{1a''}$ and $R_{1b''}$) is read as a 0, a voltage between the middle threshold voltage and the highest threshold voltage (e.g., between $R_{1b''}$ and $R_{1c''}$) is read as a 1, and a voltage greater than the highest threshold voltage (e.g., greater than $R_{1c''}$) is read as a 0.

The assist reads used during LSB optimal threshold estimation (e.g., FIG. 12A) and MSB optimal threshold estimation (e.g., FIG. 12B) have a greater tolerance for error than the two assist reads used during CSB optimal threshold estimation. To put it another way, the threshold voltages for assist reads during the LSB and MSB process can be chosen very roughly, but the threshold voltages for the two assist reads for the CSB process need to be chosen more carefully. As such, the assists reads chosen for the LSB and MSB process may not necessarily be reusable for the two assist reads for the CSB process and in this example at least, new assist read values are selected (i.e., assist read 1210 from FIG. 12A is not the same as assist read 1230 from FIG. 12C, and assist read 1220 from FIG. 12B is not the same as assist read 1240 from FIG. 12C). However, if desired, the two assist reads chosen for the CSB process can be reused for the assist reads for the LSB and MSB.

FIG. 13 is a diagram illustrating an embodiment of reads performed in order to estimate optimal thresholds for TLC storage. In the example shown, reads 1300 are used to estimate optimal read thresholds for the LSB of the TLC storage and correspond to the example of FIG. 12A. Reads 1302 are used to estimate optimal read thresholds for the MSB of the TLC storage and correspond to the example of FIG. 12B. Reads 1304 are used to estimate optimal read thresholds for the CSB of the TLC storage and correspond to the example of FIG. 12C. Note the sequence shown herein is merely exemplary and is not intended to be limiting. For example, the reads may be interspersed with reads to other locations in solid state storage, and the bits (e.g., LSB, MSB, and CSB) may be processed in any order.

As shown herein, optimal threshold estimation can be performed for TLC storage using 22 reads with the assistance of assist reads. In contrast, if assist reads were not used, then 12 reads would be needed in order to estimate optimal thresholds for the LSB, 12 reads would be needed in order to estimate optimal thresholds for the MSB, and 18 reads would be needed in order to estimate optimal thresholds for the CSB; this is a total of 42 reads.

Figure 14:
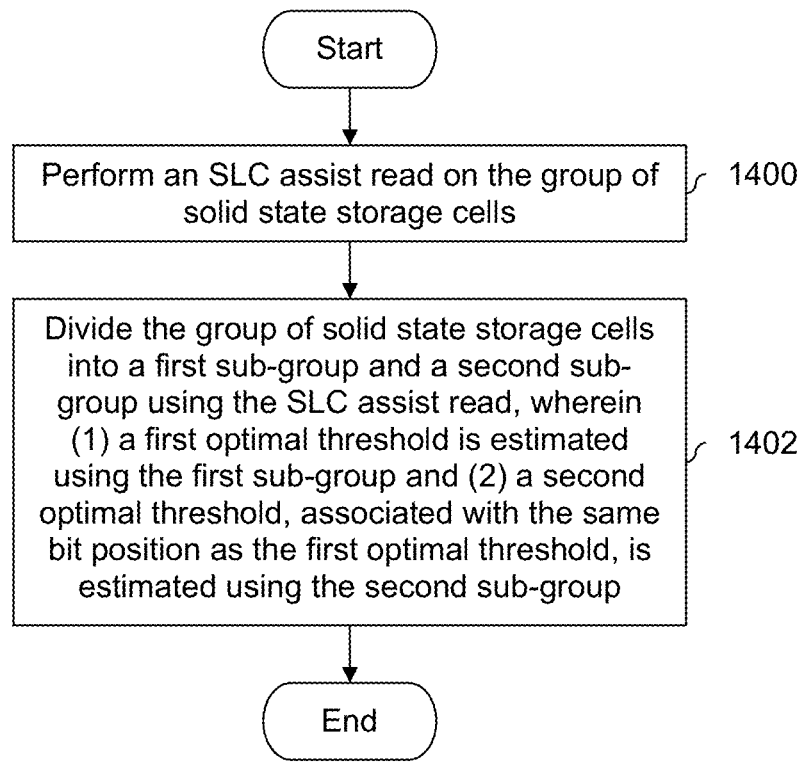
FIG. 14 is a flowchart illustrating an embodiment of a process for estimating 2 optimal thresholds, associated with the same bit, using an SLC assist read.

FIG. 14 is a flowchart illustrating an embodiment of a process for estimating 2 optimal thresholds, associated with the same bit, using an SLC assist read. At 1400, an SLC assist read is performed on the group of solid state storage cells. At 1402, the group of solid state storage cells is divided into a first sub-group and a second sub-group using the SLC assist read, wherein (1) a first optimal threshold is estimated using the first sub-group and (2) a second optimal threshold, associated with the same bit position as the first optimal threshold, is estimated using the second sub-group.

In one example application of FIG. 14, the process is performed on MLC storage in order to estimate 2 optimal thresholds associated with the MSB. See, e.g., FIGS. 10 and 11.

In another example application of FIG. 14, the process is performed on TLC storage in order to estimate 2 optimal thresholds associated with the LSB. See, e.g., FIG. 12A.

In another example application of FIG. 14, the process is performed on TLC storage in order to estimate 2 optimal thresholds associated with the MSB. See, e.g., FIG. 12B.

Figure 15A:
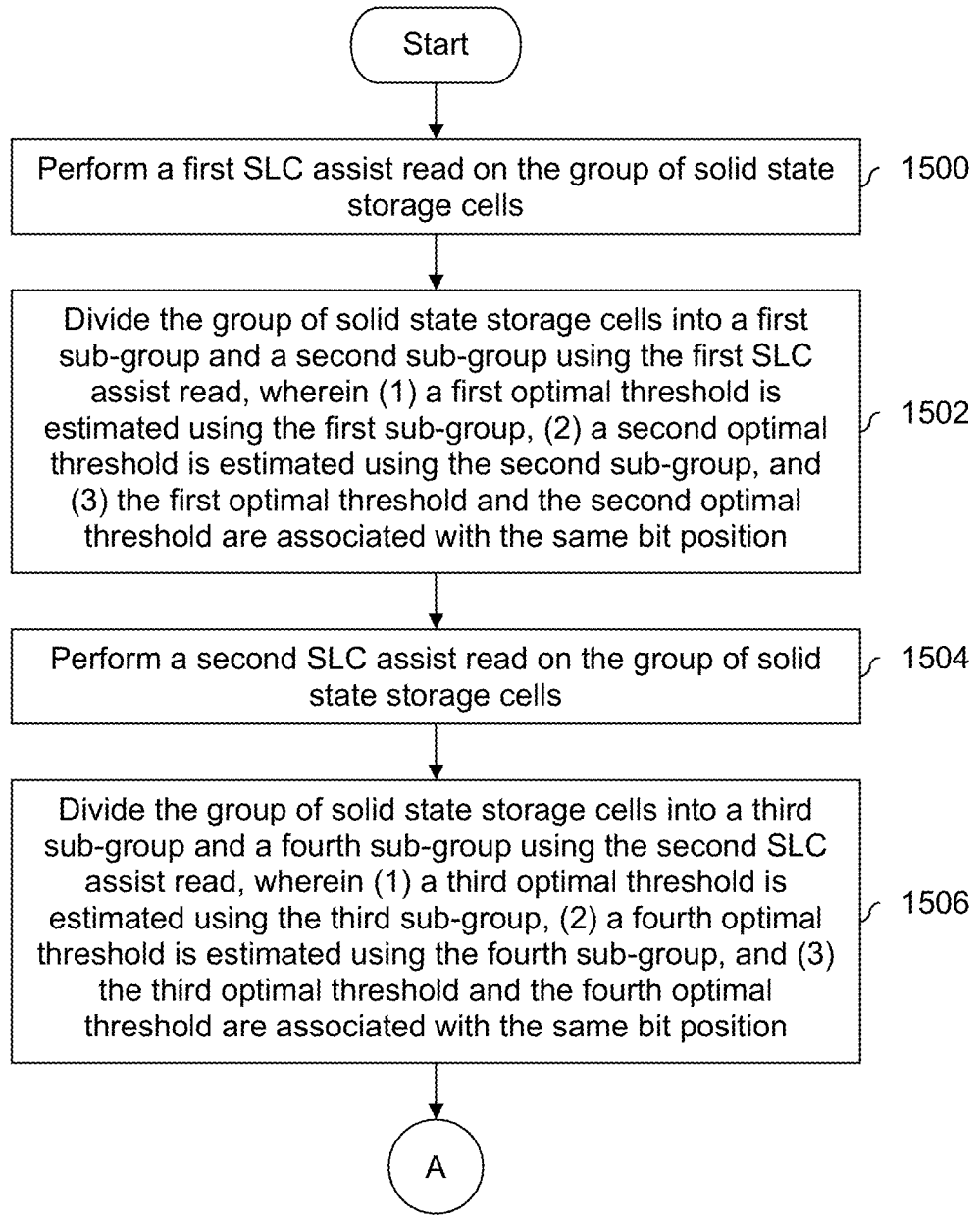
FIGS. 15A and 15B are a flowchart illustrating an embodiment of a process for estimating optimal thresholds for TLC storage using an SLC assist read.
Figure 15B:
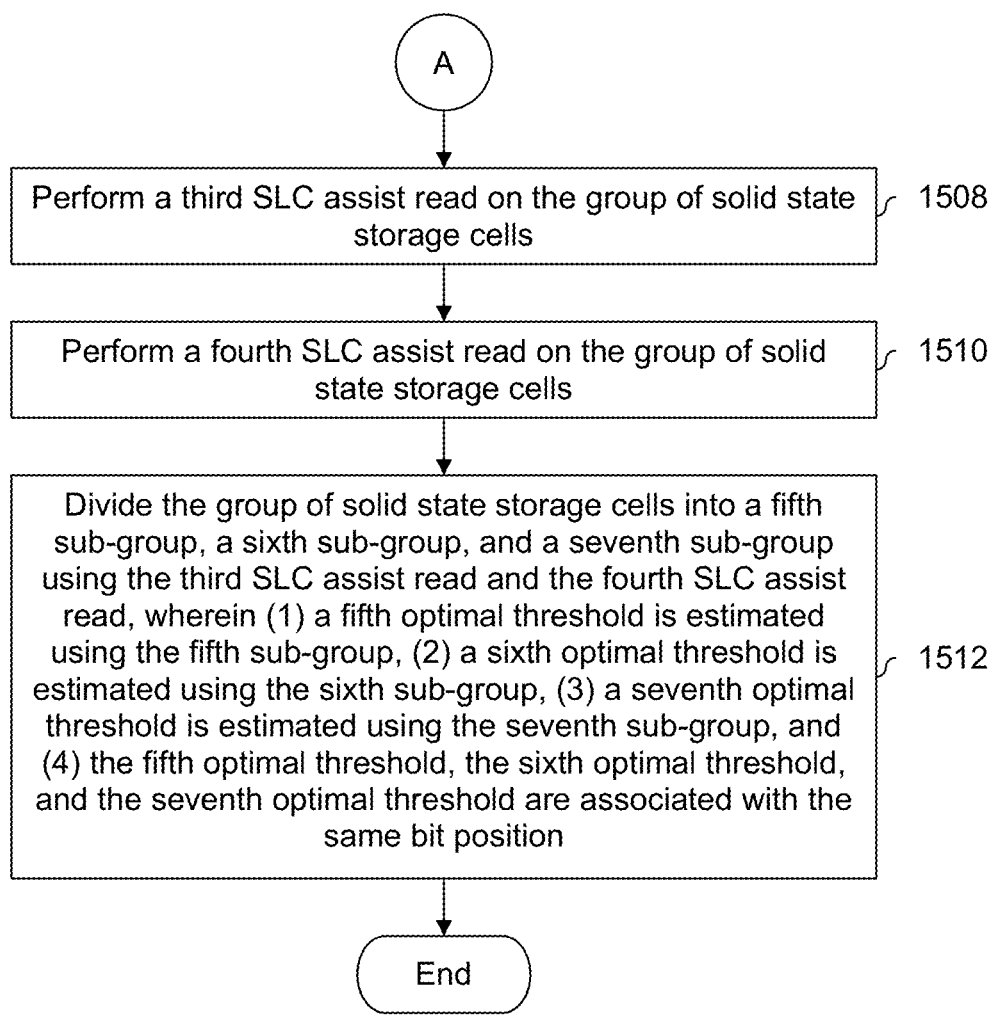

FIGS. 15A and 15B are a flowchart illustrating an embodiment of a process for estimating optimal thresholds for TLC storage using an SLC assist read.

At 1500, a first SLC assist read is performed on the group of solid state storage cells. At 1502, the group of solid state storage cells is divided into a first sub-group and a second sub-group using the first SLC assist read, wherein (1) a first optimal threshold is estimated using the first sub-group, (2) a second optimal threshold is estimated using the second sub-group, and (3) the first optimal threshold and the second optimal threshold are associated with the same bit position.

FIG. 12A shows an example of steps 1500 and 1502.

At 1504, a second SLC assist read is performed on the group of solid state storage cells. At 1506, the group of solid state storage cells is divided into a third sub-group and a fourth sub-group using the second SLC assist read, wherein (1) a third optimal threshold is estimated using the third sub-group, (2) a fourth optimal threshold is estimated using the fourth sub-group, and (3) the third optimal threshold and the fourth optimal threshold are associated with the same bit position.

FIG. 12B shows an example of steps 1504 and 1506.

At 1508, a third SLC assist read is performed on the group of solid state storage cells. At 1510, a fourth SLC assist read is performed on the group of solid state storage cells. At 1512, the group of solid state storage cells is divided into a fifth sub-group, a sixth sub-group, and a seventh sub-group using the third SLC assist read and the fourth SLC assist read, wherein (1) a fifth optimal threshold is estimated using the fifth sub-group, (2) a sixth optimal threshold is estimated using the sixth sub-group, (3) a seventh optimal threshold is estimated using the seventh sub-group, and (4) the fifth optimal threshold, the sixth optimal threshold, and the seventh optimal threshold are associated with the same bit position.

FIG. 12C shows an example of steps 1508, 1510, and 1512.

Figure 16:
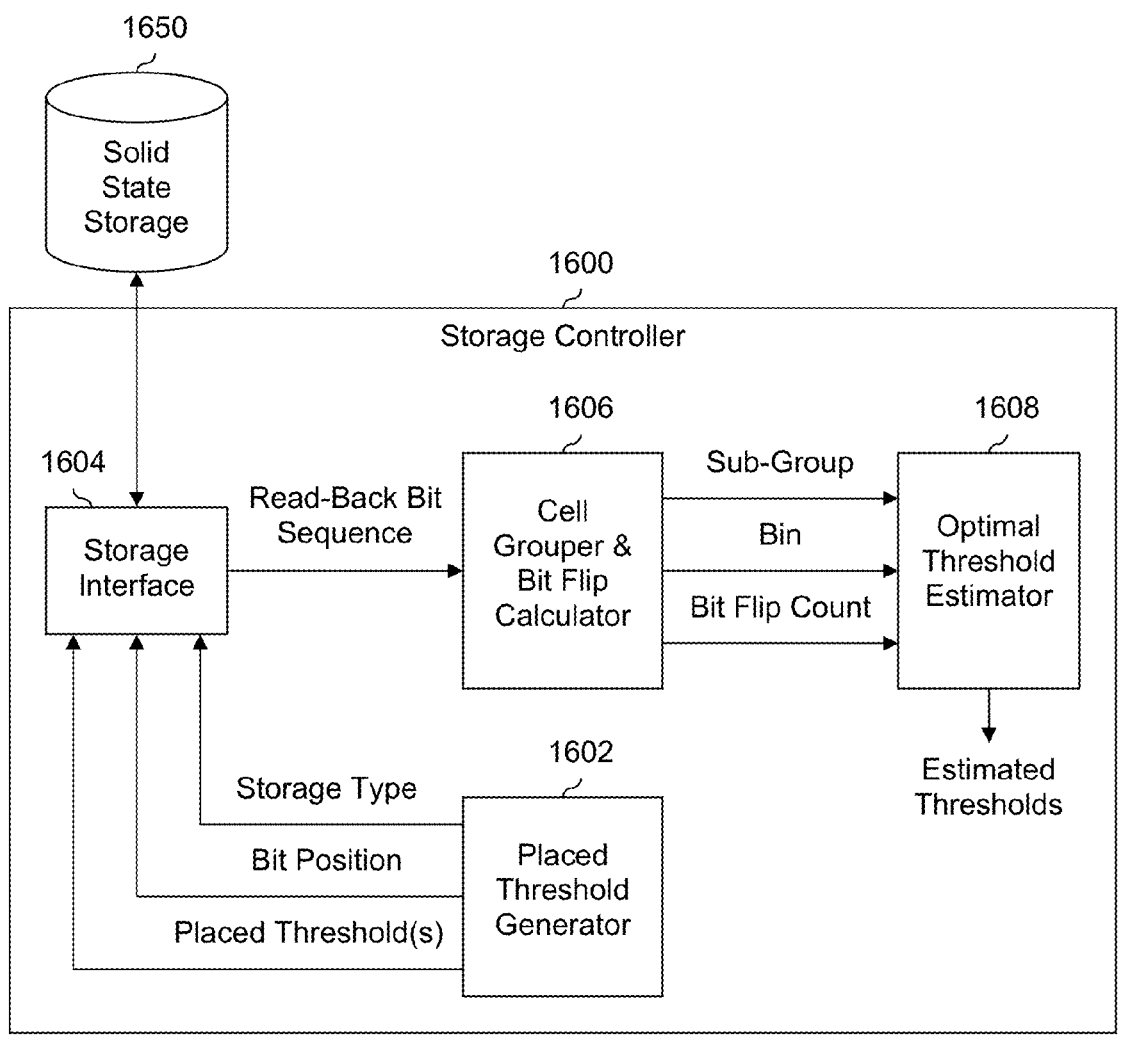
FIG. 16 is a diagram illustrating an embodiment of a storage controller which performs optimal threshold estimation, including one or more SLC read assists.

FIG. 16 is a diagram illustrating an embodiment of a storage controller which performs optimal threshold estimation, including one or more SLC read assists. Storage controller 1600 illustrates an example of a system which performs the process of FIG. 14 or FIG. 15.

Placed threshold generator 1602 generates a storage type signal, a bit position signal, and one or more placed thresholds and passes those signals to storage interface 1604. The storage type signal indicates to storage interface 1604 whether solid state storage 1650 should be read as SLC storage, MLC storage, TLC storage, etc. If the storage type signal is MLC or TLC, then the bit position signal is used to indicate what bit position should be read (e.g., LSB, CSB, MSB, etc.). Naturally, if the signal type is SLC then the bit position signal is ignored. Depending upon the storage type specified and/or the bit position specified, the appropriate number of placed thresholds are generated and passed to storage interface 1604.

For example, for assist read 1102 in FIG. 11, the storage type signal would be "SLC," the bit position signal would not be relevant, and a single threshold voltage at threshold voltage 1008 in FIG. 10 would be generated. For read 1104, the storage type signal would be "MLC," the bit position signal would be "MSB," and two threshold voltages at $A_1$ and $C_1$ would be generated.

Returning to FIG. 16, storage interface 1604 performs the specified read(s) on solid state storage 1650 using the specified placed threshold(s). The read-back bit sequences are passed from storage interface 1604 to cell grouper and bit flip calculator 1606.

Cell grouper and bit flip calculator 1606 generates 3 signals: a sub-group, a bin, and a bit flip count. The sub-group signal indicates which bins (and their bit flip count) should be grouped together during optimal threshold estimation. For example, for bins 1-5 in FIG. 10, the sub-group signal would be set to "A" whereas for bins 7-11 the sub-group signal would be set to "C." Note that although the bins used to estimate the optimal LSB threshold are not shown in FIG. 10, cell grouper and bit flip calculator 1606 also generates bins and corresponding bit flip counts for the optimal LSB threshold. For example, the sub-group signal may be set to "B" (e.g., corresponding to the optimal threshold associated with the threshold voltage at which distributions 1003 and 1004 intersect each other).

Optimal threshold estimator 1608 generates the estimated thresholds. Using FIG. 10 as an example, optimal threshold estimator 1608 would perform an estimation process once on the bins and bit flip counts where the sub-group is set to "A" and a second time for the bins and bit flip counts where the sub-group is set to "C." Although not shown in FIG. 10, optimal threshold estimator 1608 may also perform an estimation process for a third time where the sub-group is set to "B" (i.e., for the LSB of the MLC storage).

As described above, in some embodiments, a curve is fitted to data points (e.g., where the x-coordinate corresponds to the center of the bin and the y-coordinate corresponds to the bit flip count for that bin) during optimal threshold estimation. The following figure describes an embodiment in which the data points are filtered before curve fitting is performed. As will be shown in the example, this enables the resulting curve to have a minimum which is closer to the actual optimal threshold, which results in better estimates of the optimal threshold.

FIG. 17 is a diagram illustrating an embodiment of curves which are fitted to filtered data points and unfiltered data points. In the example shown, a threshold ($\beta$) associated with a difference between adjacent bit flip counts is used to filter the data points (or, to think of it another way, filter the number of bins and corresponding bit flip counts) which are used in optimal threshold estimation prior to curve fitting.

Once the value of $\beta$ is selected, it is used (at least in this example) in the following manner. First, bit flip counts for each bin are obtained. Then, the differences in bit flip counts between adjacent bins are determined. With all of the differences obtained, any number of outer bins are trimmed (e.g., from the left going inwards, or from the right going inwards) so that there are (at most) 2 differences that exceed the specified $\beta$: the leftmost pair of bins (after any trimming) and/or the rightmost pair of bins (after any trimming). The other differences between adjacent bins must be less than the specified value of $\beta$, otherwise more trimming still needs to be performed.

In diagram 1700, $\beta=100$. The bins shown in diagram 1700 are the result of the bin trimming process described above. In this example, the difference in bit flip counts between the bin centered at 25 and the bin centered at 37 exceeds 100. Similarly, the difference in bit flip counts between the bin centered at 85 and the bin centered at 97 exceeds 100. All other differences between adjacent bins are less than 100.

In diagram 1750, $\beta=50$. As such, the difference in bit flip counts between the bin centered at 49 and the bin centered at 61 exceeds 50. The difference in bit flip counts between the bin centered at 73 and the bin centered at 85 also exceeds 50. However, the difference in bit flip counts between the bin centered at 61 and the bin centered at 73 is less than 50.

Fitted curve 1710 in diagram 1700 and fitted curve 1712 in diagram 1750 show the fitted curves which result from the respective filtered data points. Fitted curve 1710 in diagram 1700 produces an estimated optimal threshold 1720 of 59 units. This is an error of 18 units compared to the actual optimal threshold at 1730. In contrast, fitted curve 1712 in diagram 1750 produces an estimated optimal threshold 1722 of 71 units, which has an error of 6 units compared to the actual optimal threshold at 1730.

As shown herein, in some embodiments, the number of bins or data points (i.e., N), may be varied using a threshold, $\beta$. This enables the most relevant data points (i.e., those closest to the cross-over point between two distributions) to be used by the fitting process. Less relevant data points (i.e., further away from the cross-over point between two distributions) are not considered by the curve fitting process. This enables the fitted curve to have its minimum closer to the actual minimum, producing a better quality estimate.

In some embodiments, a trimming process checks (e.g., prior to curve fitting) to see if a minimum number of bins remain after trimming. Using diagram 1750 as an example, suppose the minimum is 5 bins so that the results shown in diagram 1750 are insufficient and an additional bin needs to be added back in. The bin to the left of the bin centered at 49 and the bin to the right of the bin centered at 85 are both candidates to be added back in. For convenience, those bins (not shown) are referred to hereafter as the left bin candidate and the right bin candidate, respectively. If the left bin candidate and the bin centered at 49 have a smaller difference than the right bin candidate and the bin centered at 85, then the left bin candidate is added back in. Otherwise, the right bin candidate is added back in. In some embodiments, a minimum number of bins relates to the type of curve being fitted (e.g., a minimum of 2 data points is required to fit a line, a minimum of 3 data points is required to fit a quadratic function, etc.).

Figure 18:
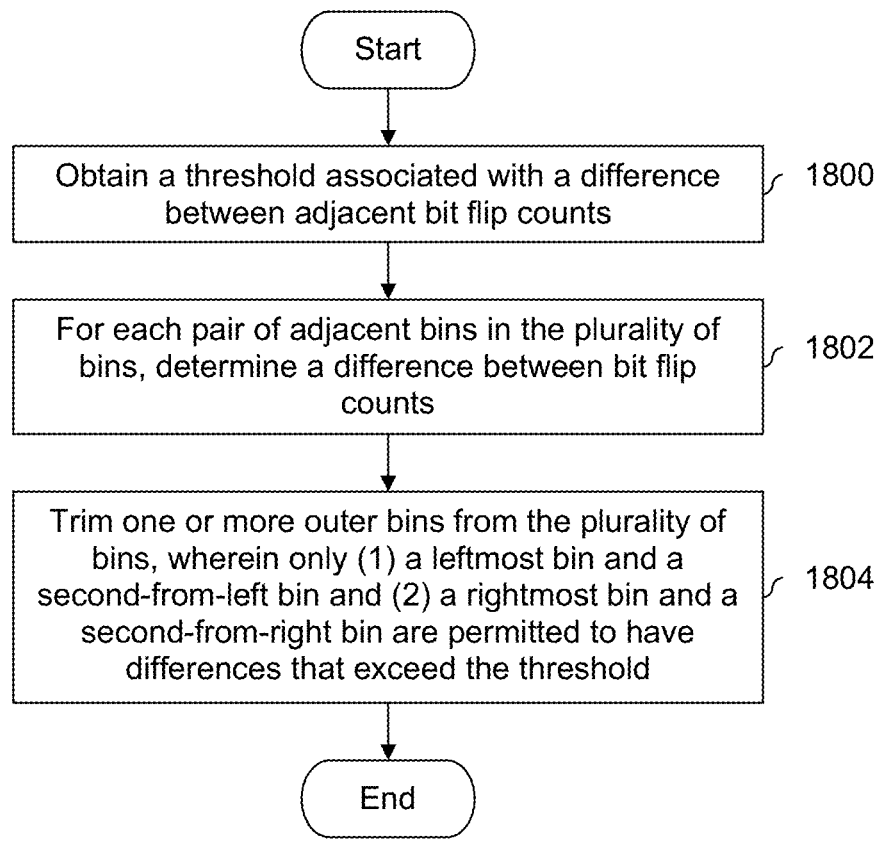
FIG. 18 is a flowchart illustrating an embodiment of a process for trimming data points before a curve fitting process is performed.

FIG. 18 is a flowchart illustrating an embodiment of a process for trimming data points before a curve fitting process is performed. In some examples of how the process may be used, the process may be performed between steps 100 and 102 in FIG. 1, between steps 100 and 102a in FIG. 4, and/or between steps 100 and 102b in FIG. 7.

At 1800, a threshold associated with a difference between adjacent bit flip counts is obtained. For example, in FIG. 17, $\beta=100$ in diagram 1700 and in diagram 1750, $\beta=50$.

At 1802, for each pair of adjacent bins in the plurality of bins, a difference between bit flip counts is determined. For example, if the bin centers and bit flip counts are: (61, 25), (71, 10), (81, 427), (91, 5211), and (101, 12430), then the differences would be: 15, 417, 4784, and 7219.

At 1804, one or more outer bins from the plurality of bins are trimmed, wherein only (1) a leftmost bin and a second-from-left bin and (2) a rightmost bin and a second-from-right bin are permitted to have differences that exceed the threshold.

To continue the example from above, if $\beta=500$, then the bin centers and bit flip counts that would remain after trimming would be: (61, 25), (71, 10), (81, 427), and (91, 5211). As illustrated in this example, although the leftmost pair of adjacent bins and the rightmost pair of adjacent bins are permitted to exceed the threshold, they are not required to (e.g., in the event one or both of the leftmost pair of adjacent bins and the rightmost pair of adjacent bins have differences which do not exceed the threshold from the beginning).

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A method for estimating an optimal threshold, comprising:
  using a processor to determine a bit flip count for each bin in a plurality of bins, including by: (1) performing a first read on a group of solid state storage cells at a first threshold that corresponds to a lower bound for a given bin and (2) performing a second read on the group of solid state storage cells at a second threshold that corresponds to an upper bound for the given bin;
  determining a minimum including determining a minimum bin corresponding to a bin having a lowest bit flip count, by using the bit flip counts corresponding to the plurality of bins; and using the minimum to estimate an optimal threshold, including setting the estimate of the optimal threshold to be the center of the minimum bin.

2. The method of claim 1, wherein the optimal threshold is associated with reading one or more of the following: single-level cell (SLC) solid state storage, multi-level cell (MLC) solid state storage, or tri-level cell (TLC) solid state storage.

3. The method of claim 1, further comprising:
performing a single-level cell (SLC) assist read on the group of solid state storage cells; and
dividing the group of solid state storage cells into a first sub-group and a second sub-group using the SLC assist read, wherein (1) a first optimal threshold is estimated using the first sub-group and (2) a second optimal threshold, associated with a same bit position as the first optimal threshold, is estimated using the second sub-group.

4. The method of claim 3, wherein the first optimal threshold and the second optimal threshold are associated with a least significant bit (LSB) in multi-level cell (MLC) solid state storage.

5. The method of claim 3, wherein the first optimal threshold and the second optimal threshold are associated with a most significant bit (MSB) in multi-level cell (MLC) solid state storage.

6. The method of claim 3, wherein the first optimal threshold and the second optimal threshold are associated with a least significant bit (LSB) a tri-level cell (TLC) solid state storage.

7. The method of claim 3, wherein the first optimal threshold and the second optimal threshold are associated with a center significant bit (CSB) in tri-level cell (TLC) solid state storage.

8. The method of claim 3, wherein the first optimal threshold and the second optimal threshold are associated with a most significant bit (MSB) in tri-level cell (TLC) solid state storage.

9. The method of claim 1, further comprising:
performing a first single-level cell (SLC) assist read on the group of solid state storage cells;
dividing the group of solid state storage cells into a first sub-group and a second sub-group using the first SLC assist read, wherein (1) a first optimal threshold is estimated using the first sub-group, (2) a second optimal threshold is estimated using the second sub-group, and (3) the first optimal threshold and the second optimal threshold are associated with a same bit position;
performing a second SLC assist read on the group of solid state storage cells; and
dividing the group of solid state storage cells into a third sub-group and a fourth sub-group using the second SLC assist read, wherein (1) a third optimal threshold is estimated using the third sub-group, (2) a fourth optimal threshold is estimated using the fourth sub-group, and (3) the third optimal threshold and the fourth optimal threshold are associated with a same bit position.

10. The method of claim 1, further comprising:
performing a third SLC assist, read on the group of solid state storage cells;
performing a fourth SLC assist read on the group of solid state storage cells; and
dividing the group of solid state storage cells into a fifth sub-group, a sixth sub-group, and seventh sub-group using the third SLC assist read and the fourth SLC assist read, wherein (1) a fifth optimal threshold is estimated using the fifth sub-group, (2) a sixth optimal threshold is estimated using the sixth sub-group, (3) a seventh optimal threshold is estimated using the seventh sub-group, and (4) the fifth optimal threshold, the sixth optimal threshold, and the seventh optimal threshold are associated with a same bit position.

11. The method of claim 10, wherein the fifth optimal threshold, the sixth optimal threshold, and the seventh optimal threshold are associated with a center significant bit (CSB) in tri-level cell (TLC) solid state storage.

12. A system for estimating an optimal threshold, comprising:
a storage interface configured to:
(1) perform a first read on a group of solid state storage cells at a first threshold that corresponds to a lower bound for a given bin; and
(2) perform a second read on the group of solid state storage cells at a second threshold that corresponds to an upper bound for the given bin;
a bit flip calculator configured to determine a bit flip count for each bin in a plurality of bins; and
an optimal threshold estimator configured to:
determine a minimum including determining a minimum bin corresponding to a bin having a lowest bit flip count, by using the bit flip counts corresponding to the plurality of bins; and
use the minimum to estimate an optimal threshold including setting the estimate of the optimal threshold m be the center of the minimum bin.

13. The system of claim 12, wherein:
the storage interface is further configured to perform a single-level cell (SLC) assist read on the group of solid state storage cells; and
the system further includes a cell grouper configured to divide the group of solid state storage cells into first sub-group and a second sub-group using the SLC assist read, wherein (1) a first optimal threshold is estimated using the first sub-group and (2) a second optimal threshold, associated with a same bit position as the first optimal threshold, is estimated using the second sub-group.

14. The system of claim 13, wherein the first optimal threshold and the second optimal threshold are associated with a least significant hit (LSB) in multi-level cell (MLC) solid state storage.

15. The system of claim 13, wherein the first optimal threshold and the second optimal threshold are associated with a most significant bit (MSB) in multi-level cell (MLC) solid state storage.

16. The system of claim 13, wherein the first optimal threshold and the second optimal threshold are associated with a least significant bit (LSB) in tri-level cell (TLC) solid state storage.

17. The system of claim 13, wherein the first optimal threshold and the second optimal threshold are associated with a center significant bit (CSB) in tri-level cell (TLC) solid state storage.

18. The system of claim 13, wherein the first optimal threshold and the second optimal threshold are associated with a most significant bit (MSB) in tri-level cell (TLC) solid state storage.

19. The system of claim 12, wherein:
the storage interface is further configured to:
perform a first single-level cell (SLC) assist read on the group of solid state storage cells; and perform a second SLC assist read on the group of solid state storage cells; and the system further includes a cell grouper configured to:
divide the group of solid state storage cells into a first sub-group and a second sub-group using the first SLC assist read, wherein (1) a first optimal threshold is estimated using the first sub-group, (2) a second optimal threshold is estimated using the second sub-group, and (3) the first optimal threshold and the second optimal threshold are associated with a same bit position; and divide the group of solid state storage cells into a third sub-group and a fourth sub-group using the second SLC assist read, wherein (1) a third optimal threshold is estimated using the third sub-group, (2) a fourth optimal threshold is estimated using the fourth sub-group, and (3) the third optimal threshold and the fourth optimal threshold are associated with a same bit position.

20. The system of claim 12, wherein:
the storage interface is further configured to;
perform a third SLC assist read on the group of solid state storage cells; and
perform a fourth SLC assist read on the group of solid state storage cells; and
the cell grouper is further configured to divide the group of solid state storage cells into a fifth sub-group, a sixth sub-group, and a seventh sub-group using the third SLC assist read and the fourth SLC assist read, wherein (1) a fifth optimal threshold is estimated using the fifth sub-group, (2) a sixth optimal threshold is estimated using, the sixth sub-group, (3) a seventh optimal threshold is estimated, using the seventh sub-group, and (4) the fifth optimal threshold, the sixth optimal threshold, and the seventh optimal threshold are associated with a same bit position.

21. A computer program product for estimating an optimal threshold, the computer program product being embodied in a non-transitory computer readable storage medium and comprising computer instructions for:
determining a bit flip count for each bin in a plurality of bins, including by: (1) performing a first read on a group of solid state storage cells at a first threshold that corresponds to a lower bound for a given bin and (2) performing a second read on the group of solid state storage cells at a second threshold that corresponds to an upper bound for the given bin;
determining a minimum including determining a minimum bin corresponding to a bin having a lowest bit flip count, by using the bit flip counts corresponding to the plurality of bins; and
using the minimum to estimate an optimal threshold including setting the estimate of the optimal threshold to be the center of the minimum bin.

* * * * *